US010804411B2

(12) United States Patent
Chang et al.

(10) Patent No.: US 10,804,411 B2
(45) Date of Patent: Oct. 13, 2020

(54) SEMICONDUCTOR DEVICE AND METHOD OF FORMING THE SAME

(71) Applicant: TAIWAN SEMICONDUCTOR MANUFACTURING COMPANY LTD., Hsinchu (TW)

(72) Inventors: Yu-Hsing Chang, Taipei (TW); Chern-Yow Hsu, Hsin-Chu County (TW); Shih-Chang Liu, Kaohsiung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 43 days.

(21) Appl. No.: 16/136,896

(22) Filed: Sep. 20, 2018

(65) Prior Publication Data

US 2019/0165188 A1 May 30, 2019

Related U.S. Application Data

(60) Provisional application No. 62/592,288, filed on Nov. 29, 2017.

(51) Int. Cl.
*H01L 21/00* (2006.01)
*H01L 29/94* (2006.01)
(Continued)

(52) U.S. Cl.
CPC .......... *H01L 29/94* (2013.01); *H01L 21/0271* (2013.01); *H01L 21/76877* (2013.01);
(Continued)

(58) Field of Classification Search
CPC .... H01L 29/94; H01L 28/87; H01L 21/76877
See application file for complete search history.

(56) References Cited

U.S. PATENT DOCUMENTS 10,446,483 B2\* 10/2019 Gu .................... H01L 28/60
2015/0295019 A1\* 10/2015 Wang ................ H01L 23/585
257/532
(Continued)

FOREIGN PATENT DOCUMENTS

CN        1366686 A     8/2002
CN    101651044 A     2/2010
(Continued)

OTHER PUBLICATIONS

Notice of Allowance dated Nov. 27, 2019 issued by Taiwan Intellectual Property Office for counterpart application No. 107140257.
(Continued)

*Primary Examiner* — Laura M Menz
(74) *Attorney, Agent, or Firm* — WPAT, P.C., Intellectual Property Attorneys; Anthony King

(57) ABSTRACT

A semiconductor device includes a capacitive device, a first conductive via, and a second conductive via. The capacitive device includes a first conductive plate, a first insulating plate, a second conductive plate, a second insulating plate, and a third conductive plate. The first conductive via is electrically coupled to the first conductive plate and the third conductive plate, and the first conductive via penetrated through a first film stack with a first thickness. The second conductive via is electrically coupled to the second conductive plate, and the second conductive via penetrated through a second film stack with a second thickness. The second thickness is substantially equal to the first thickness.

20 Claims, 42 Drawing Sheets

(51) Int. Cl.
*H01L 21/027* (2006.01)
*H01L 23/522* (2006.01)
*H01L 49/02* (2006.01)
*H01L 21/768* (2006.01)

(52) U.S. Cl.
CPC .......... *H01L 23/5223* (2013.01); *H01L 28/40* (2013.01); *H01L 28/87* (2013.01)

(56) References Cited

U.S. PATENT DOCUMENTS

| | | | |
|---|---|---|---|
| 2017/0278963 A1* | 9/2017 | Liu | H01L 21/76897 |
| 2018/0197946 A1* | 7/2018 | Leobandung | H01L 23/5223 |
| 2019/0013269 A1* | 1/2019 | Zhang | H01L 21/76877 |
| 2019/0165188 A1* | 5/2019 | Chang | H01L 28/87 |
| 2019/0221515 A1* | 7/2019 | Gu | H01L 23/5223 |
| 2019/0393298 A1* | 12/2019 | Lin | H01L 28/75 |
| 2020/0006471 A1* | 1/2020 | Fernandes | H01L 21/32133 |
| 2020/0035683 A1* | 1/2020 | Sharma | H01L 29/41733 |

FOREIGN PATENT DOCUMENTS

| | | |
|---|---|---|
| CN | 103293790 A | 9/2013 |
| JP | 2005039006 A | 2/2005 |
| TW | 564445 B | 12/2003 |
| TW | 201801154 | 1/2018 |

OTHER PUBLICATIONS

Search Report issued by Taiwan Intellectual Property Office for counterpart application No. 107140257.
US Patent Publication 20170278963 serves as an English Translation to Foreign Reference TW201801154A.
Office Action and Search Report dated May 18, 2020 issued by China National Intellectual Property Office for counterpart application No. 201811434042.0.

* cited by examiner

SEMICONDUCTOR DEVICE AND METHOD OF FORMING THE SAME

CROSS-REFERENCE TO RELATED APPLICATION

This application claims the benefit of U.S. Provisional Application No. 62/592,288, filed on Nov. 29, 2017, which is incorporated by reference in its entirety.

BACKGROUND

The semiconductor industry continues to improve the integration density of various electronic components (e.g., capacitors) by continual reductions in minimum feature size, which allow more components to be integrated into a given area. These smaller electronic components also require smaller packages that utilize less area than packages of the past, in some applications.

One type of capacitor is a triple-plate metal-insulator-metal (TP-MIM) capacitor. Triple-plate metal-insulator-metal capacitors may be used as decoupling capacitors. A triple-plate metal-insulator-metal capacitor is formed horizontally on a semiconductor wafer, with three metal plates sandwiching two dielectric layers parallel to the wafer surface. However, there are many challenges related to the triple-plate metal-insulator-metal capacitor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
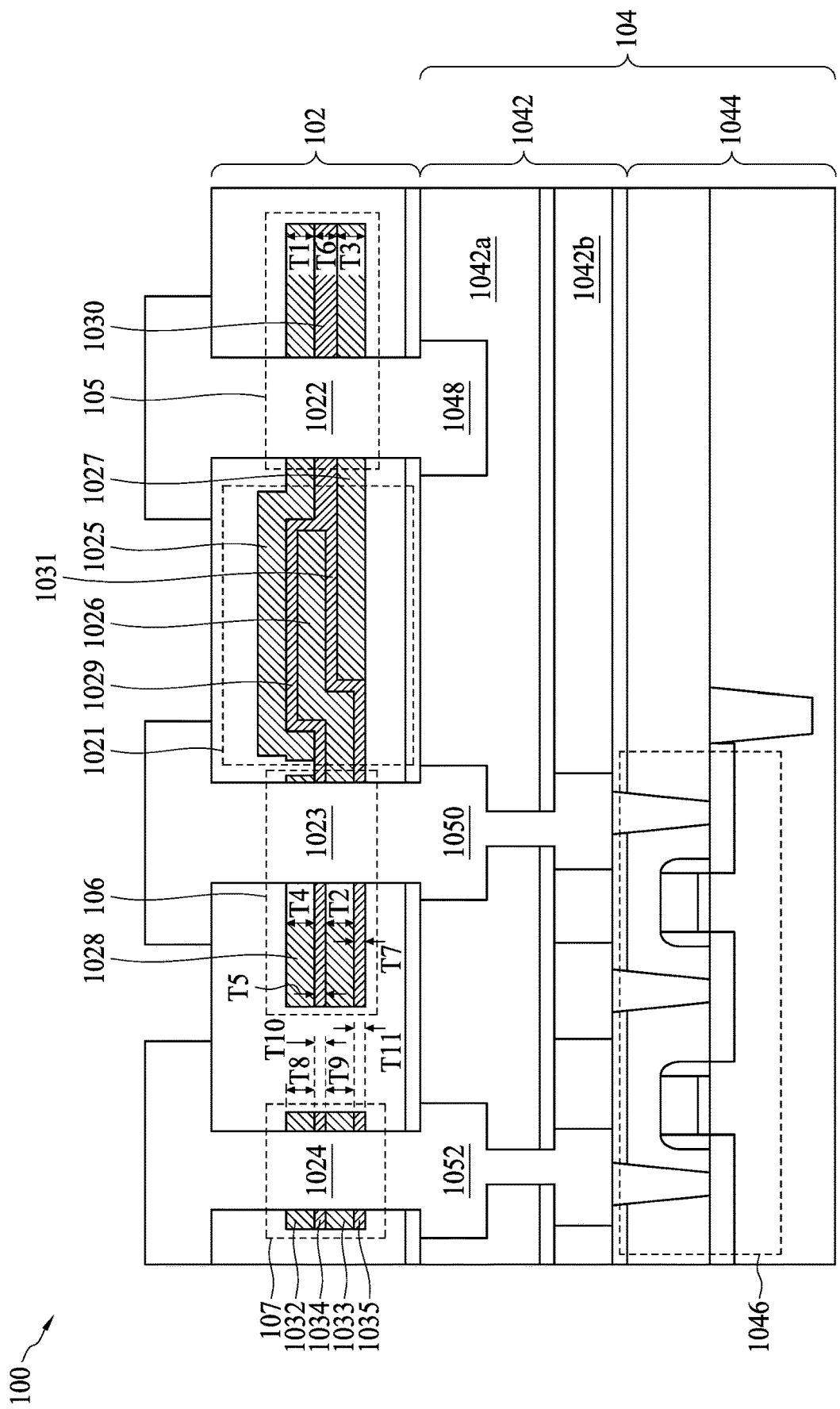
FIG. 1 is a cross-sectional diagram illustrating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a cross-sectional diagram illustrating a semiconductor device 100 in accordance with some embodiments. The semiconductor device 100 comprises a dielectric stack 102 and an integrated circuit (IC) device 104. The dielectric stack 102 is formed on the IC device 104. The dielectric stack 102 may be arranged to protect the integrated device 104 from the moisture or dust ingress. A passive circuit cell is formed inside the dielectric stack 102. According to some embodiments, the passive circuit cell may be a triple-plate metal-insulator-metal (TP-MIM) capacitor 1021 having a first conductive via 1022 and a second conductive via 1023. However, this is not a limitation of the present embodiment. The TP-MIM capacitor 1021 may also be replaced with a two-plate MIM capacitor. The first conductive via 1022 is arranged to electrically connect to the top and bottom plates of the TP-MIM capacitor 1021, and the second conductive via 1023 is arranged to electrically connect to the middle plate of the TP-MIM capacitor 1021. A third conductive via 1024 is further formed in the dielectric stack 102 for electrically connecting a logic circuit (e.g. 1046) in the IC device 104. The IC device 104 comprises an interconnect structure 1042 and a semiconductor structure 1044. The interconnect structure 1042 may include metal lines and vias, which are formed in inter-layer dielectric (ILD). Integrated circuits 1046 such as transistors may be formed in and/or on the semiconductor structure 1044. According to some embodiments, the first conductive via 1022, the second conductive via 1023, and the third conductive via 1024 are electrically connected to the top metal lines 1048, 1050, and 1052 of the interconnect structure 1042 respectively.

The TP-MIM capacitor 1021 comprises a first conductive plate 1025, a second conductive plate 1026, a third conductive plate 1027, a fourth conductive plate 1028, a first insulating plate 1029, a second insulating plate 1030, and a third insulating plate 1031. The first insulating plate 1029 is disposed between the first conductive plate 1025 and the second conductive plate 1026. The second insulating plate 1030 is disposed between the first conductive plate 1025 and the third conductive plate 1027. The third insulating plate 1031 is disposed between the second conductive plate 1026 and the third conductive plate 1027. The fourth conductive plate 1028 is disposed on the first insulating plate 1029. The first insulating plate 1029 and the third insulating plate 1031 are connected to the second insulating plate 1030. The first conductive via 1022 is arranged to penetrate through the first conductive plate 1025, the second insulating plate 1030, and the third conductive plate 1027. The second conductive via 1023 is arranged to penetrate through the fourth conductive plate 1028, the first insulating plate 1029, the second conductive plate 1026, and the third insulating plate 1031. According to some embodiments, the first conductive plate 1025, the second conductive plate 1026, and the third conductive plate 1027 are the top conductive plate, the intermediate conductive plate, and the bottom conductive plate of the TP-MIM capacitor 1021 respectively.

The thicknesses of the first conductive plate 1025, the second conductive plate 1026, the third conductive plate 1027, the fourth conductive plate 1028, the first insulating plate 1029, the second insulating plate 1030, and the third insulating plate 1031 are T1, T2, T3, T4, T5, T6, and T7 respectively. According to some embodiments, the thickness T2 of the second conductive plate 1026 is substantially equal to the thickness T3 of the third conducive plate 1027. The thickness T4 of the fourth conductive plate 1028 is substantially equal to the thickness T1 of the first conducive plate 1025. The thickness T6 of the second insulating plate 1030 is substantially equal to a total of the thickness T5 of the first insulating plate 1029 and thickness T7 of the third insulating plate 1031. Therefore, the total thickness (i.e. T1+T6+T3) of the film stack 105 of conductive plates and insulating plates penetrated by the first conductive via 1022 is substantially equal to the total thickness (i.e. T4+T5+T2+T7) the film stack 106 of conductive plates and insulating plates penetrated by the second conductive via 1023.

According to some embodiments, the semiconductor device 100 further comprises a film stack 107 formed in the dielectric stack 102. The film stack 107 comprises a fifth conductive plate 1032, a second conductive plate 1033, a first insulating plate 1034, and a second insulating plate 1035. The third conductive via 1024 is arranged to penetrate through the first conductive plate 1032, the second conductive plate 1033, the first insulating plate 1034, and the second insulating plate 1035. The second conductive plate 1033 is disposed on the second insulating plate 1033. The first insulating plate 1034 is disposed on the second conductive plate 1033. The first conductive plate 1032 is disposed on the first insulating plate 1034. The thicknesses of the first conductive plate 1032, the second conductive plate 1033, the first insulating plate 1034, and the second insulating plate 1035 are T8, T9, T10, and T11 respectively. According to some embodiments, the thickness T8 of the first conductive plate 1032 is substantially equal to the thickness T1 of the first conductive plate 1025, the thickness T9 of the second conductive plate 1033 is substantially equal to the thickness T2 of the second conductive plate 1026, the thickness T10 of the first insulating plate 1034 is substantially equal to the thickness T5 of the first insulating plate 1029, and the thickness T11 of the second insulating plate 1035 is substantially equal to the thickness T7 of the third insulating plate 1031. Therefore, the total thickness (i.e. T8+T10+T9+T11) of the film stack 107 of conductive plates and insulating plates penetrated by the third conductive via 1024 is substantially equal to the total thickness (i.e. T1+T6+T3) of the film stack 105 of conductive plates and insulating plates penetrated by the first conductive via 1022 and/or the total thickness (i.e. T4+T5+T2+T7) the film stack 106 of conductive plates and insulating plates penetrated by the second conductive via 1023.

Accordingly, when the film stack 105 penetrated by the first conductive via 1022, the film stack 106 penetrated by the second conductive via 1023, and the film stack 107 penetrated by the third conductive via 1024 are substantially equal, the etching operation to form the holes corresponding to the first conductive via 1022, the second conductive via 1023, and the third conductive via 1024 is relatively easy to be controlled during the fabrication process. Specifically, during the fabrication process, the film stack 107 and the TP-MIM capacitor 1021 are formed inside the dielectric stack 102 before the etching operation. When an etchant down etches the portions of the dielectric stack 102 to form the holes corresponding to the first conductive via 1022, the second conductive via 1023, and the third conductive via 1024 during the etching operation, the etchant may need to etch through the same amount of films (e.g. two layers of conductive plate and two layers of insulating plates) inside the dielectric stack 102. As the film arrangement inside the dielectric stack 102 are substantially equal, the etching speeds of forming the holes corresponding to the first conductive via 1022, the second conductive via 1023, and the third conductive via 1024 are also equal during the etching operation. When the etching operation is stop, the depths of the holes corresponding to the first conductive via 1022, the second conductive via 1023, and the third conductive via 1024 are substantially equal. Moreover, by controlling the etching time of the etchant, the bottoms of the holes corresponding to the first conductive via 1022, the second conductive via 1023, and the third conductive via 1024 may be controlled to just expose the top surfaces of the top metal lines 1048, 1050, and 1052 respectively. In other words, the etchant may not excessively etch any of the top metal lines 1048, 1050, and 1052 during the forming the holes corresponding to the first conductive via 1022, the second conductive via 1023, and the third conductive via 1024.

Figure 2:
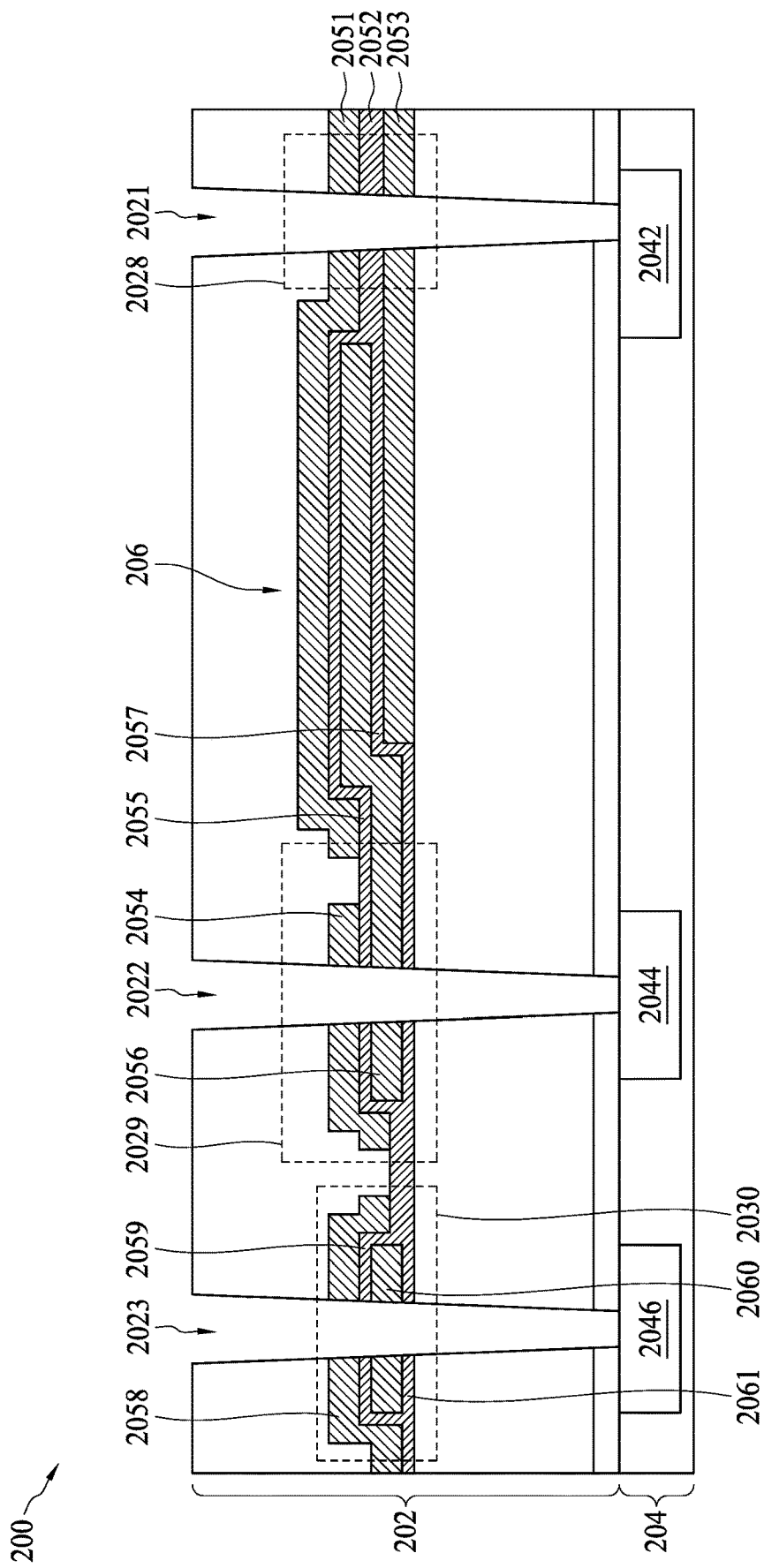
FIG. 2 is a cross-sectional diagram illustrating a semiconductor device in accordance with some embodiments.

FIG. 2 is a cross-sectional diagram illustrating a semiconductor device 200 in accordance with some embodiments. The semiconductor device 200 comprises a dielectric stack 202 and an IC device 204. The dielectric stack 202 is formed on the IC device 204. For brevity, merely a plurality of top metal lines 2042, 2044, and 2046 of the IC device 204 are shown in FIG. 2. Moreover, for the purpose of description, a plurality of holes 2021, 2022, and 2023 are formed, e.g., through an etching operation, to expose the top surfaces of the top metal lines 2042, 2044, and 2046 respectively. The holes 2021, 2022, and 2023 are to be filled with conductive material to form the corresponding conductive vias connected to the top metal lines 2042, 2044, and 2046. The holes 2021, 2022, and 2023 are arranged to penetrate the film stacks 2028, 2029, and 2030 to reach the top surfaces of the top metal lines 2042, 2044, and 2046 respectively. It is noted that, for brevity, the TP-MIM capacitor 206 is omitted here for brevity.

According to some embodiments, the film stack 2028 comprises a first conductive plate 2051, an insulating plate 2052, and a second conductive plate 2053. The insulating plate 2052 is disposed on the second conductive plate 2053. The first conductive plate 2051 is disposed on the insulating plate 2052.

The film stack 2029 comprises a first conductive plate 2054, a first insulating plate 2055, a second conductive plate 2056, and a second insulating plate 2057. The second conductive plate 2056 is disposed on the second insulating plate 2057. The first insulating plate 2055 is disposed on the second conductive plate 2056. The first conductive plate 2054 is disposed on the first insulating plate 2055.

The film stack 2030 comprises a first conductive plate 2058, a first insulating plate 2059, a second conductive plate 2060, and a second insulating plate 2061. The second conductive plate 2060 is disposed on the second insulating plate 2061. The first insulating plate 2059 is disposed on the second conductive plate 2060. The first conductive plate 2058 is disposed on the first insulating plate 2059.

According to some embodiments, the thickness of the insulating plate 2052 is substantially equal to a total of the thickness of the first insulating plate 2055 and the second insulating plate 2057, and equal to a total of the thickness of the first insulating plate 2059 and the second insulating plate 2061. The thickness of the first conductive plate 2051 is substantially equal to the thickness of the first conductive plate 2054, and equal to the thickness of the first conductive plate 2058. The thickness of the second conductive plate 2053 is substantially equal to the thickness of the second conductive plate 2056, and equal to the thickness of the second conductive plate 2060. Therefore, the total thickness of the film stack 2028 penetrated by the hole 2021 is substantially equal to the total thickness of the film stack 2029 penetrated by the hole 2022 and the total thickness the film stack 2030 penetrated by the hole 2023.

Figure 3:
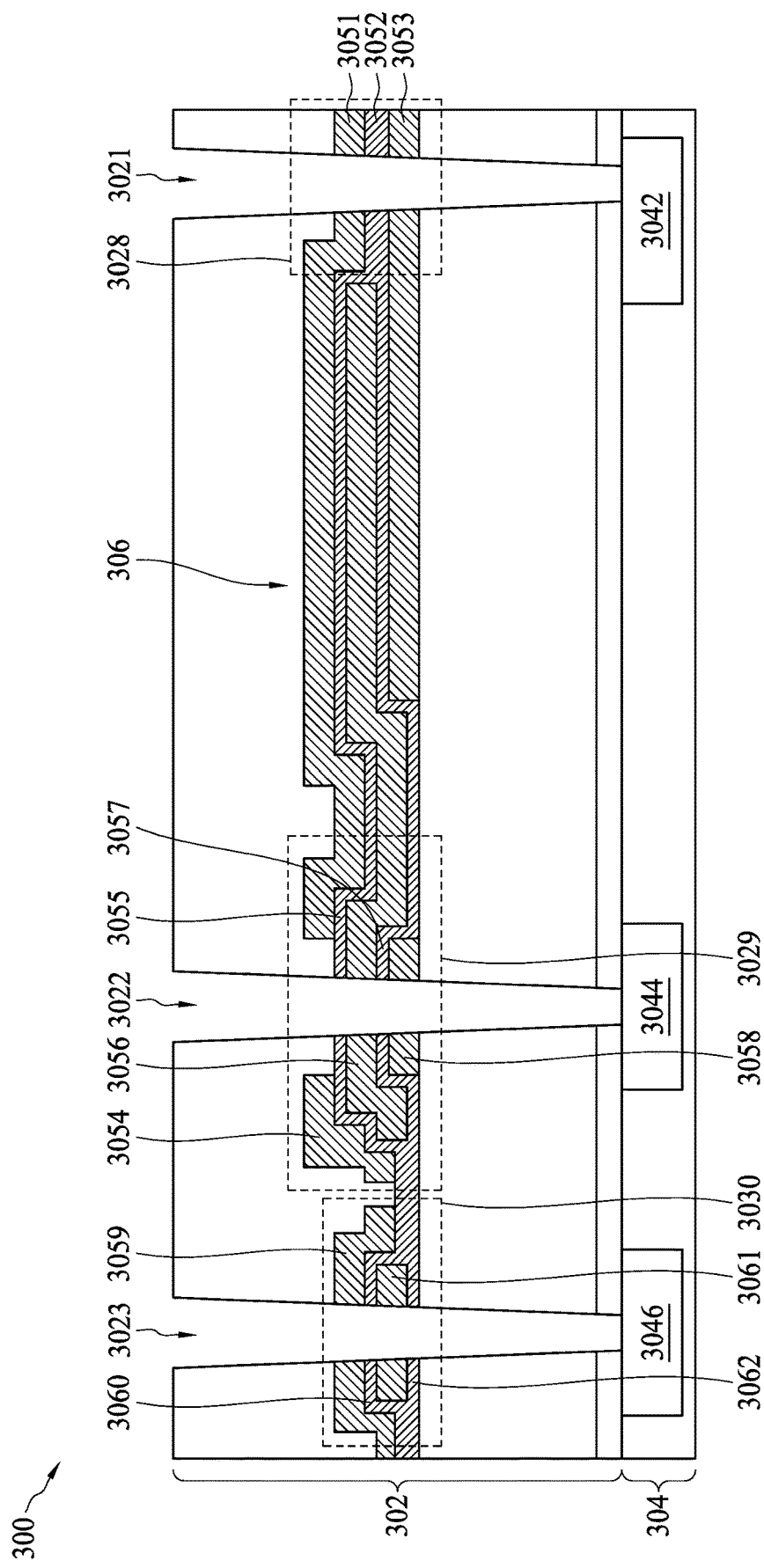
FIG. 3 is a cross-sectional diagram illustrating a semiconductor device in accordance with some embodiments.

FIG. 3 is a cross-sectional diagram illustrating a semiconductor device 300 in accordance with some embodiments. The semiconductor device 300 comprises a dielectric stack 302 and an IC device 304. For brevity, merely a plurality of top metal lines 3042, 3044, and 3046 of the IC device 304 are shown in FIG. 3. Moreover, for the purpose of description, a plurality of holes 3021, 3022, and 3023 are formed, e.g., through an etching operation, to expose the top surfaces of the top metal lines 3042, 3044, and 3046 respectively. The holes 3021, 3022, and 3023 are to be filled with conductive material to form the corresponding conductive vias connected to the top metal lines 3042, 3044, and 3046. The holes 3021, 3022, and 3023 are arranged to penetrate the film stacks 3028, 3029, and 3030 to reach the top surfaces of the top metal lines 3042, 3044, and 3046 respectively. It is noted that, for brevity, the TP-MIM capacitor 306 is omitted here for brevity.

According to some embodiments, the film stack 3028 comprises a first conductive plate 3051, an insulating plate 3052, and a second conductive plate 3053. The film stack 3028 is similar to the film stack 2028, thus the detailed description is omitted here for brevity.

The film stack 3029 comprises a first conductive plate 3054, a first insulating plate 3055, a second conductive plate 3056, a second insulating plate 3057, and a third conductive plate 3058. The second insulating plate 3057 is disposed on the third conductive plate 3058. The second conductive plate 3056 is disposed on the second insulating plate 3057. The first insulating plate 3055 is disposed on the second conductive plate 3056. The first conductive plate 3054 is disposed on the first insulating plate 3055. According to some embodiments, the first conductive plate 3054 is separated from the inner surface of the hole 3022.

The film stack 3030 comprises a first conductive plate 3059, a first insulating plate 3060, a second conductive plate 3061, and a second insulating plate 3062. The film stack 3030 is similar to the film stack 2030, thus the detailed description is omitted here for brevity.

According to some embodiments, the thickness of the insulating plate 3052 is substantially equal to a total of the thickness of the first insulating plate 3055 and the second insulating plate 3057, and equal to a total of the thickness of the first insulating plate 3060 and the second insulating plate 3062. The thickness of the first conductive plate 3051 is substantially equal to the thickness of the second conductive plate 3056, and equal to the thickness of the first conductive plate 3059. The thickness of the second conductive plate 3053 is substantially equal to the thickness of the third conductive plate 3058, and equal to the thickness of the second conductive plate 3061. Therefore, the total thickness of the film stack 3028 penetrated by the hole 3021 is substantially equal to the total thickness of the film stack 3029 penetrated by the hole 3022 and the total thickness the film stack 3030 penetrated by the hole 3023.

Figure 4:
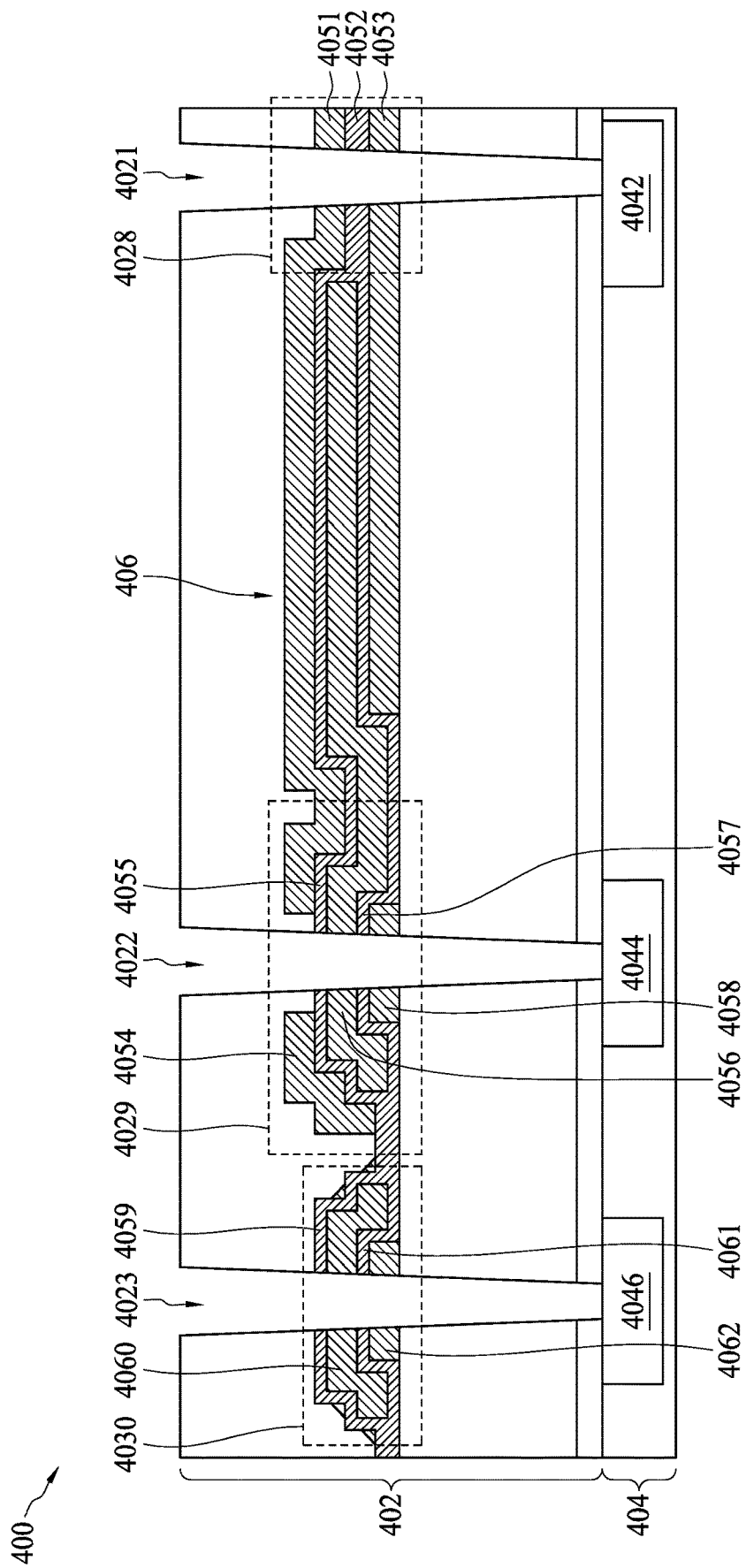
FIG. 4 is a cross-sectional diagram illustrating a semiconductor device in accordance with some embodiments.

FIG. 4 is a cross-sectional diagram illustrating a semiconductor device 400 in accordance with some embodiments. The semiconductor device 400 comprises a dielectric stack 402 and an IC device 404. For brevity, merely a plurality of top metal lines 4042, 4044, and 4046 of the IC device 404 are shown in FIG. 4. Moreover, for the purpose of description, a plurality of holes 4021, 4022, and 4023 are formed, e.g., through an etching operation, to expose the top surfaces of the top metal lines 4042, 4044, and 4046 respectively. The holes 4021, 4022, and 4023 are to be filled with conductive material to form the corresponding conductive vias connected to the top metal lines 4042, 4044, and 4046. The holes 4021, 4022, and 4023 are arranged to penetrate the film stacks 4028, 4029, and 4030 to reach the top surfaces of the top metal lines 4042, 4044, and 4046 respectively. It is noted that, for brevity, the TP-MIM capacitor 406 is omitted here for brevity.

According to some embodiments, the film stack 4028 comprises a first conductive plate 4051, an insulating plate 4052, and a second conductive plate 4053. The film stack 4028 is similar to the film stack 2028, thus the detailed description is omitted here for brevity.

The film stack 4029 comprises a first conductive plate 4054, a first insulating plate 4055, a second conductive plate 4056, a second insulating plate 4057, and a third conductive plate 4058. The film stack 4029 is similar to the film stack 3029, thus the detailed description is omitted here for brevity.

The film stack 4030 comprises a first conductive plate 4059, a first insulating plate 4060, a second conductive plate 4061, and a second insulating plate 4062. The second insulating plate 4061 is disposed on the second conductive plate 4062. The first conductive plate 4060 is disposed on the second insulating plate 4061. The first insulating plate 4059 is disposed on the first conductive plate 4060.

According to some embodiments, the thickness of the insulating plate 4052 is substantially equal to a total of the thickness of the first insulating plate 4055 and the second insulating plate 4057, and equal to a total of the thickness of the first insulating plate 4059 and the second insulating plate 4061. The thickness of the first conductive plate 4051 is substantially equal to the thickness of the second conductive plate 4056, and equal to the thickness of the first conductive plate 4060. The thickness of the second conductive plate 4053 is substantially equal to the thickness of the third conductive plate 4058, and equal to the thickness of the second conductive plate 4062. Therefore, the total thickness of the film stack 4028 penetrated by the hole 4021 is substantially equal to the total thickness of the film stack 4029 penetrated by the hole 4022 and the total thickness the film stack 4030 penetrated by the hole 4023.

Figure 5:
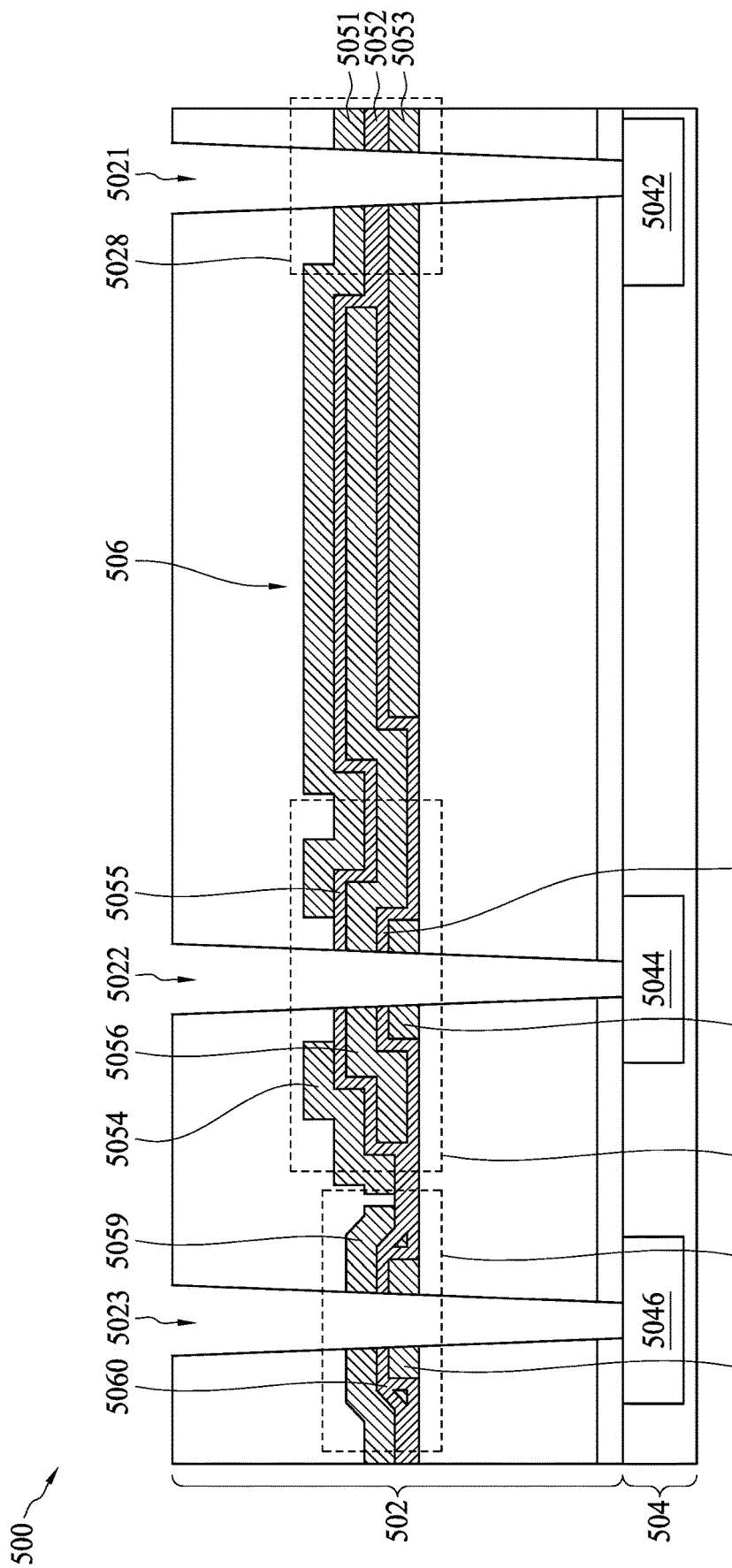
FIG. 5 is a cross-sectional diagram illustrating a semiconductor device in accordance with some embodiments.

FIG. 5 is a cross-sectional diagram illustrating a semiconductor device 500 in accordance with some embodiments. The semiconductor device 500 comprises a dielectric stack 502 and an IC device 504. For brevity, merely a plurality of top metal lines 5042, 5044, and 5046 of the IC device 504 are shown in FIG. 5. Moreover, for the purpose of description, a plurality of holes 5021, 5022, and 5023 are formed, e.g., through an etching operation, to expose the top surfaces of the top metal lines 5042, 5044, and 5046 respectively. The holes 5021, 5022, and 5023 are to be filled with conductive material to form the corresponding conductive vias connected to the top metal lines 5042, 5044, and 5046. The holes 5021, 5022, and 5023 are arranged to penetrate the film stacks 5028, 5029, and 5030 to reach the top surfaces of the top metal lines 5042, 5044, and 5046 respectively. It is noted that, for brevity, the TP-MIM capacitor 506 is omitted here for brevity.

According to some embodiments, the film stack 5028 comprises a first conductive plate 5051, an insulating plate 5052, and a second conductive plate 5053. The film stack 5028 is similar to the film stack 2028, thus the detailed description is omitted here for brevity.

The film stack 5029 comprises a first conductive plate 5054, a first insulating plate 5055, a second conductive plate 5056, a second insulating plate 5057, and a third conductive plate 5058. The film stack 5029 is similar to the film stack 3029, thus the detailed description is omitted here for brevity.

The film stack 5030 comprises a first conductive plate 5059, an insulating plate 5060, and a second conductive plate 5061. The insulating plate 5060 is disposed on the second conductive plate 5061. The first conductive plate 5059 is disposed on the insulating plate 5060.

According to some embodiments, the thickness of the insulating plate 5052 is substantially equal to a total of the thickness of the first insulating plate 5055 and the second insulating plate 5057, and equal to a total of the thickness of the insulating plate 5060. The thickness of the first conductive plate 5051 is substantially equal to the thickness of the second conductive plate 5056, and equal to the thickness of the first conductive plate 5059. The thickness of the second conductive plate 5053 is substantially equal to the thickness of the third conductive plate 5058, and equal to the thickness of the second conductive plate 5061. Therefore, the total thickness of the film stack 5028 penetrated by the hole 5021 is substantially equal to the total thickness of the film stack 5029 penetrated by the hole 5022 and the total thickness the film stack 5030 penetrated by the hole 5023.

Figure 6:
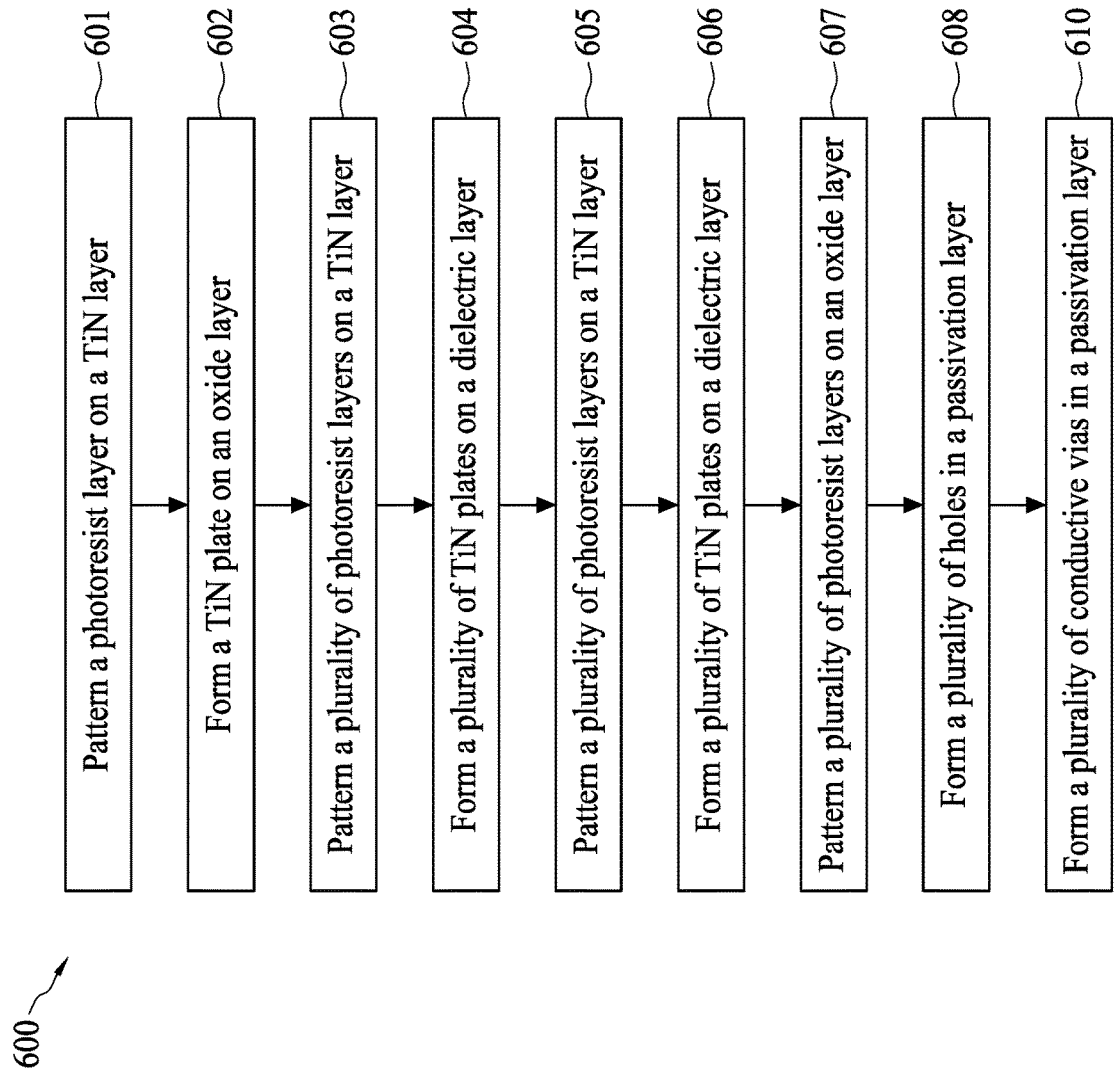
FIG. 6 is a flow diagram illustrating a method of fabricating the semiconductor device of FIG. 2 in accordance with some embodiments.

FIG. 6 is a flow diagram illustrating a method 600 of fabricating the semiconductor device 200 in accordance with some embodiments. The method 600 comprises operations 601-610. FIGS. 7-14B are diagrams illustrating stages in the fabrication of the semiconductor device 200 in accordance with some embodiments. According to some embodiments, the devices in FIGS. 7-14B correspond to the operations 601-610 of the method 600 respectively. The method 600 of FIG. 6 is a simplified semiconductor process. Therefore, other steps or operations may be incorporated in the process.

Figure 7:
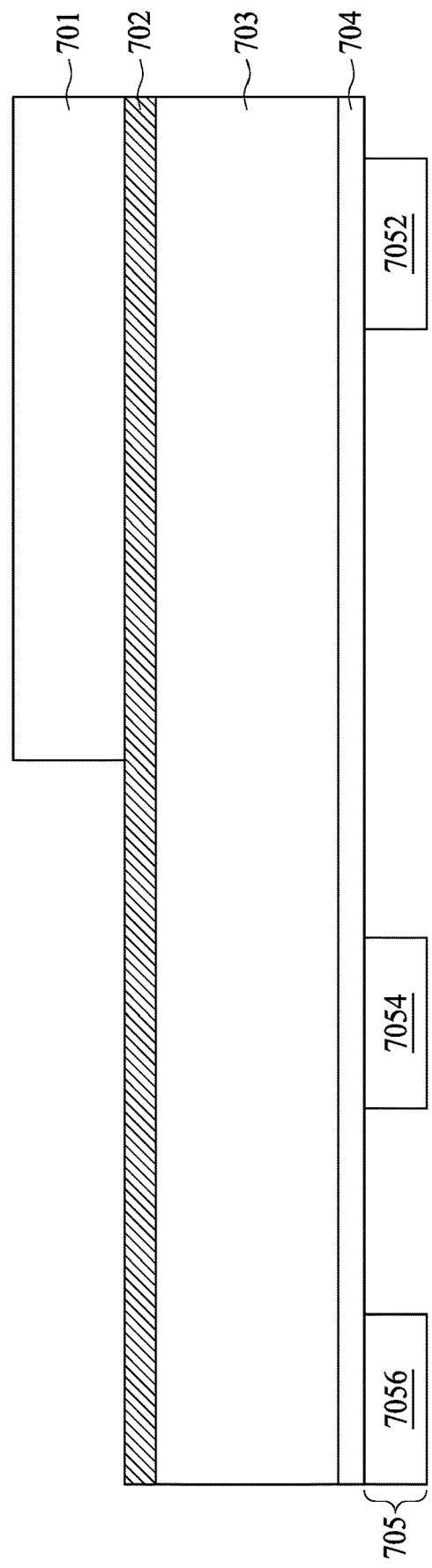
FIGS. 7-14B are diagrams illustrating stages in the fabrication of the semiconductor device of FIG. 2 in accordance with some embodiments.

Referring to FIG. 7 and operation 601, a photoresist layer is patterned on a TiN (Titanium nitride) layer. FIG. 7 is a cross-sectional view of a photoresist layer 701 patterned on a TiN layer 702 during fabrication in accordance with some embodiments. The TiN layer 702 is disposed on an oxide layer 703. The oxide layer 703 is disposed on an SiN (Silicon Mononitride) layer 704. The SiN layer 704 is disposed on an IC device 705. For brevity, merely a plurality of top metal lines 7052, 7054, and 7056 of the IC device 705 are shown in FIG. 7. The metal lines 7052, 7054, and 7056 may be composed of copper. Moreover, TiN may be replaced with other conductive materials in another embodiments.

Figure 8:
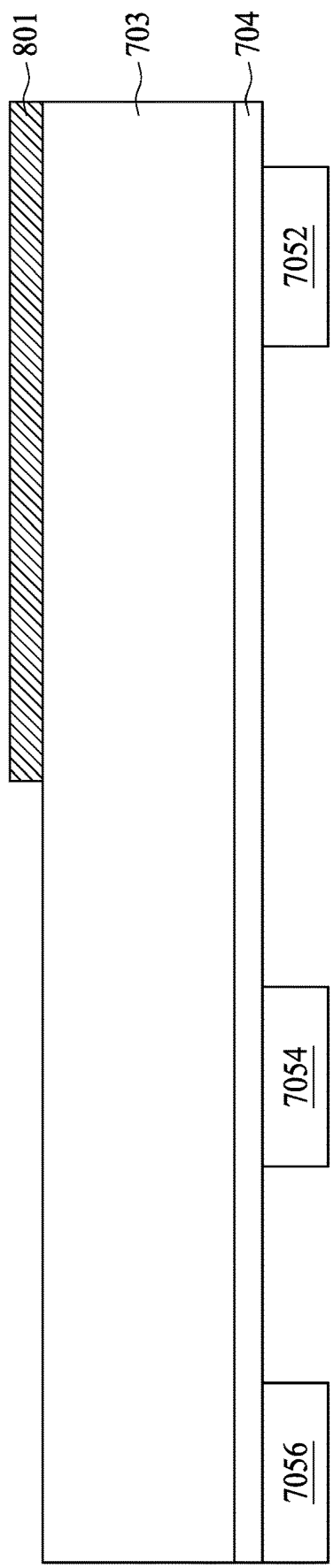

Referring to FIG. 8 and operation 602, a TiN plate is formed on an oxide layer, e.g., through a deposition operation. FIG. 8 is a cross-sectional view of a TiN plate 801 formed on the oxide layer 703 during fabrication in accordance with some embodiments. In operation 602, the portion of the TiN layer 702, which is not covered by the photoresist layer 701, is etched, and a bottom metal plate (i.e. the TiN plate 801) of a TP-MIM capacitor is formed.

Figure 9:
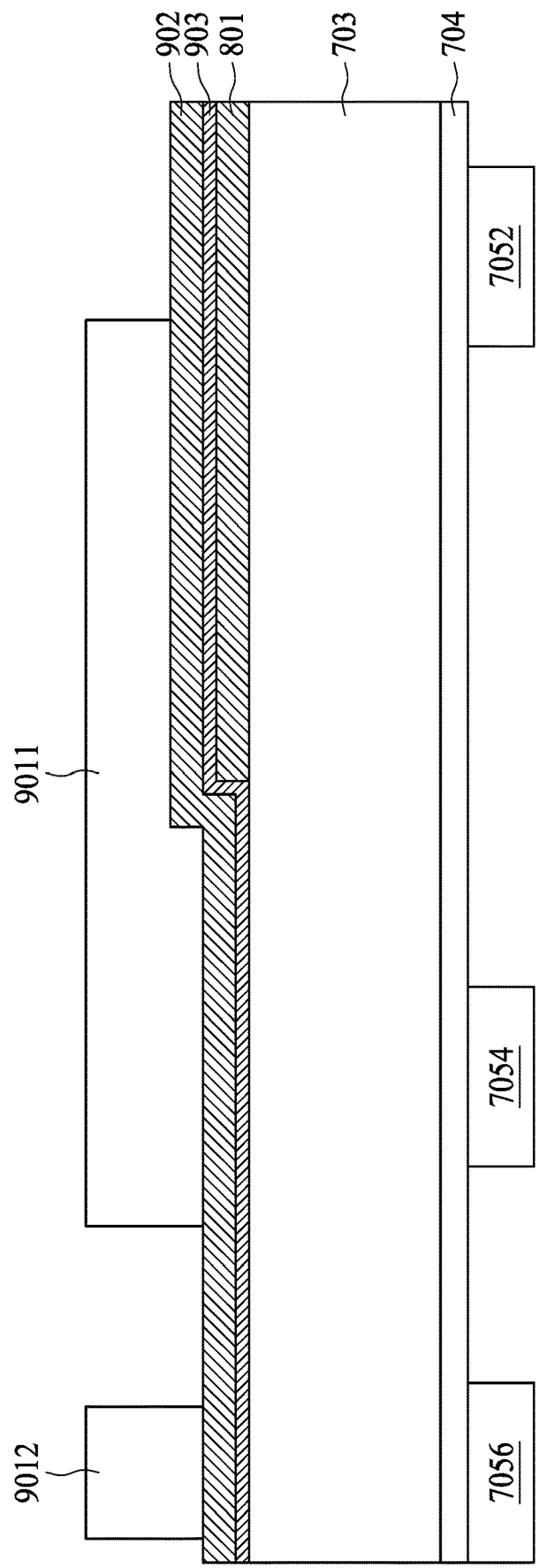

Referring to FIG. 9 and operation 603, a plurality of photoresist layers are patterned on a TiN layer. FIG. 9 is a cross-sectional view of a plurality of photoresist layers 9011 and 9011 patterned on a TiN layer 902 during fabrication in accordance with some embodiments. In operation 603, a dielectric layer 903 is disposed and patterned on the TiN plate 801 and the oxide layer 703. The TiN layer 902 is disposed on the dielectric layer 903. The dielectric layer 903 may be conformably formed, e.g., through a deposition operation, on the TiN plate 801 and the oxide layer 703. The TiN layer 902 may be conformably formed on the dielectric layer 903, e.g., through a deposition operation. The dielectric layer 903 may be composed of high dielectric constant (high-k) material.

Figure 10:
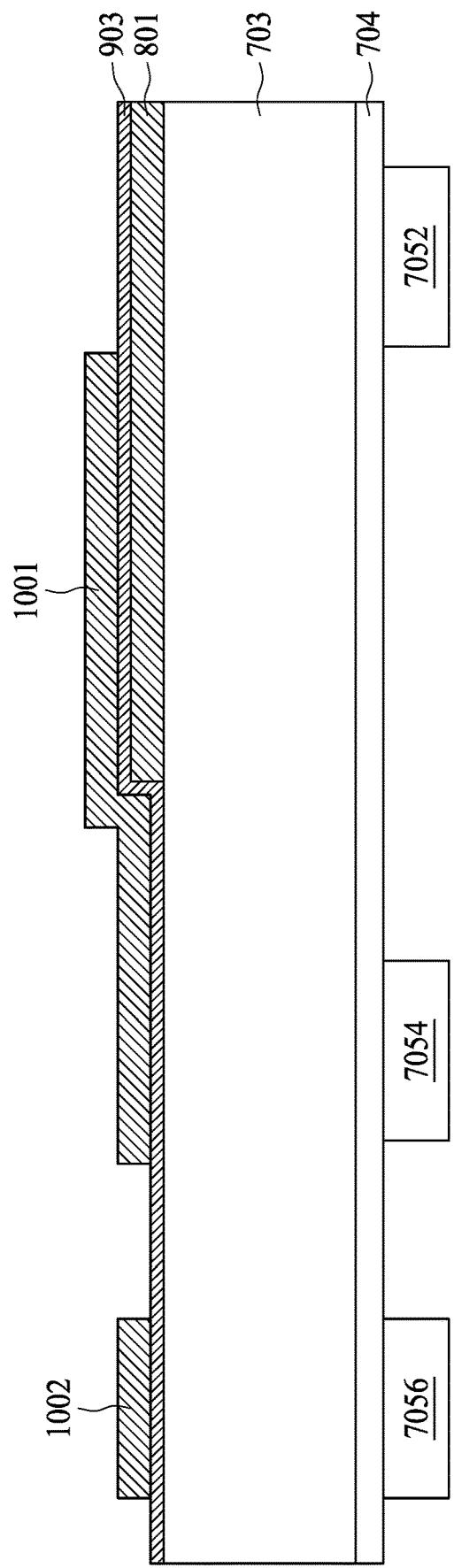

Referring to FIG. 10 and operation 604, a plurality of TiN plates are formed on a dielectric layer, e.g., through a deposition operation. FIG. 10 is a cross-sectional view of a plurality of TiN plates 1001 and 1002 formed on the dielectric layer 903 during fabrication in accordance with some embodiments. In operation 604, the portions of the TiN layer 902, which are not covered by the photoresist layers 9011 and 9012, are etched, and an intermediate metal plate (i.e. the TiN plate 1001) of the TP-MIM capacitor and a dummy TiN plate (i.e. the TiN plate 1002) are formed. According to some embodiments, the intermediate metal plate (i.e. the TiN plate 1001) of the TP-MIM capacitor and a dummy TiN plate (i.e. the TiN plate 1002) are formed at the fabricating process.

Figure 11:
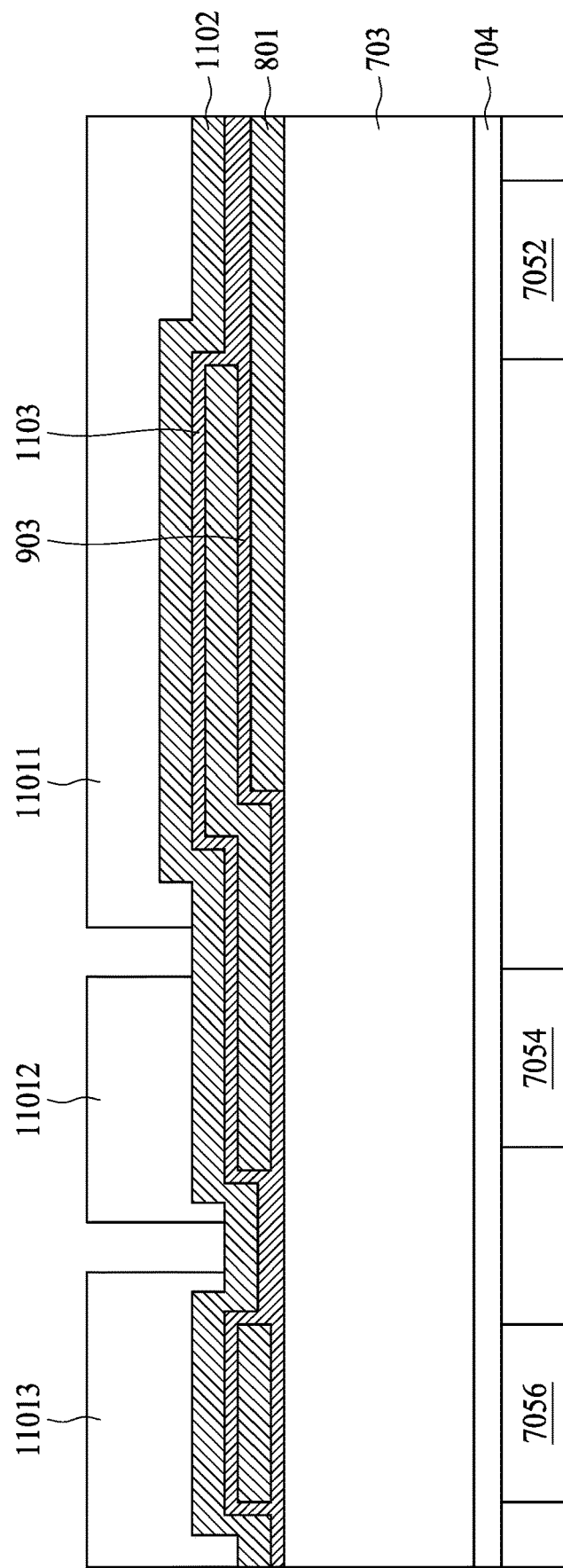

Referring to FIG. 11 and operation 605, a plurality of photoresist layers are patterned on a TiN plate. FIG. 11 is a cross-sectional view of a plurality of photoresist layers 11011, 11012, and 11013 patterned on a TiN layer 1102 during fabrication in accordance with some embodiments. In operation 605, a dielectric layer 1103 is disposed on the TiN plates 1001, 1002, and the exposed portions of the dielectric layer 903. The TiN layer 1102 is disposed on the dielectric layer 1103. The dielectric layer 1103 may be conformably formed on the TiN plates 1001, 1002, and the exposed portions of the dielectric layer 903, e.g., through a deposition operation. The TiN layer 1102 may be conformably formed on the dielectric layer 1103, e.g., through a deposition operation. The dielectric layer 1103 may be composed of high-k material.

Figure 12:
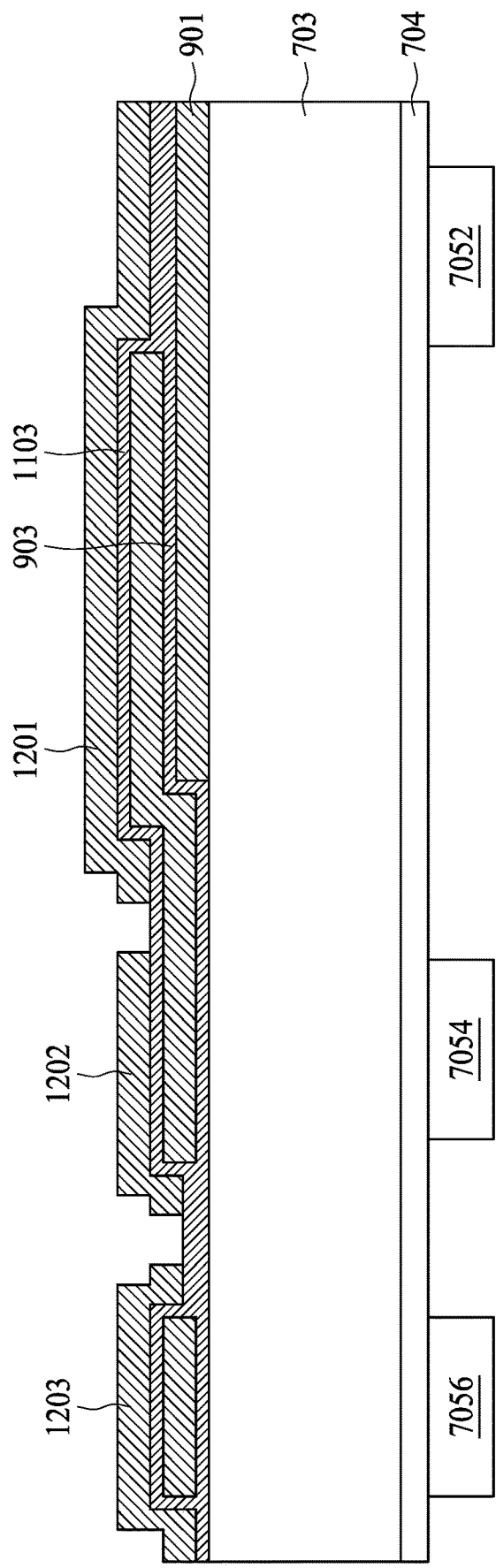

Referring to FIG. 12 and operation 606, a plurality of TiN plates are formed on a dielectric layer, e.g., through a deposition operation. FIG. 12 is a cross-sectional view of a plurality of TiN plates 1201, 1202, and 1203 formed on the dielectric layer 1103 during fabrication in accordance with some embodiments. In operation 606, the portions of the TiN layer 1102, which are not covered by the photoresist layers 11011, 11012, and 11013, are etched, and a top metal plate (i.e. the TiN plate 1201) of the TP-MIM capacitor, a first dummy TiN plate (i.e. the TiN plate 1202), and a second dummy TiN plate (i.e. the TiN plate 1203) are formed. According to some embodiments, the top metal plate (i.e. the TiN plate 1201), the first dummy TiN plate (i.e. the TiN plate 1202), and the second dummy TiN plate (i.e. the TiN plate 1203) are formed at the fabricating process.

Figure 13:
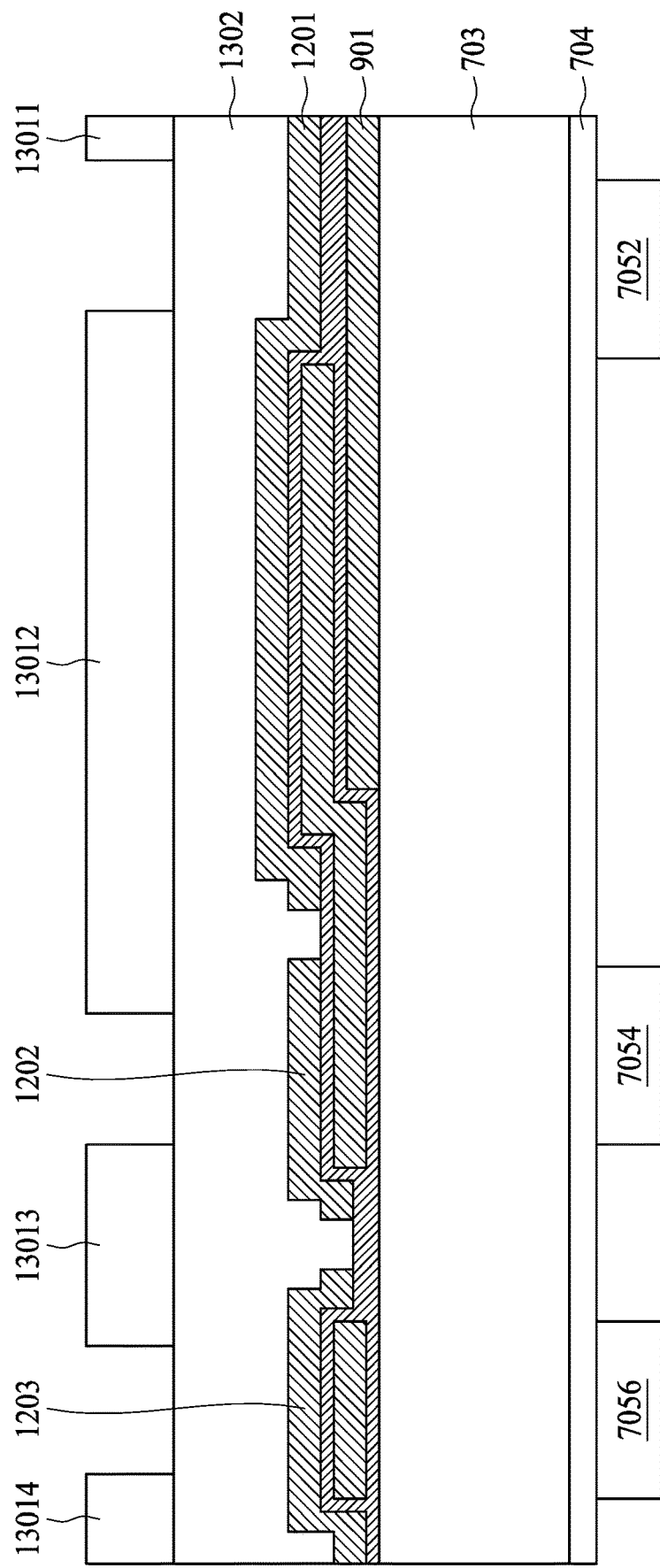

Referring to FIG. 13 and operation 607, a plurality of photoresist layers are patterned on an oxide layer. FIG. 13 is a cross-sectional view of a plurality of photoresist layers 13011, 13012, 13013, and 13014 patterned on an oxide layer 1302 during fabrication in accordance with some embodiments. In operation 607, the oxide layer 1302 is disposed on the TiN plates 1201, 1202, 1203, and the exposed portions of the dielectric layer 1103.

Figure 14A:
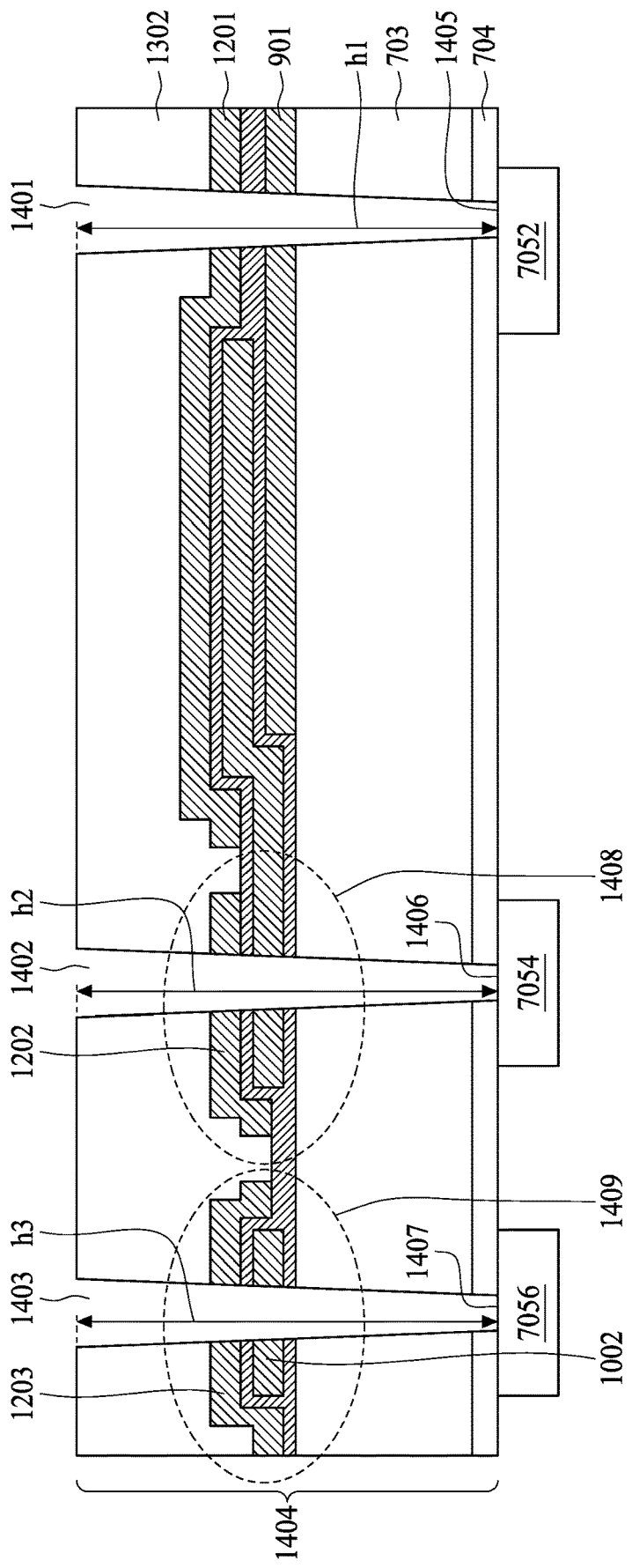
Figure 14B:
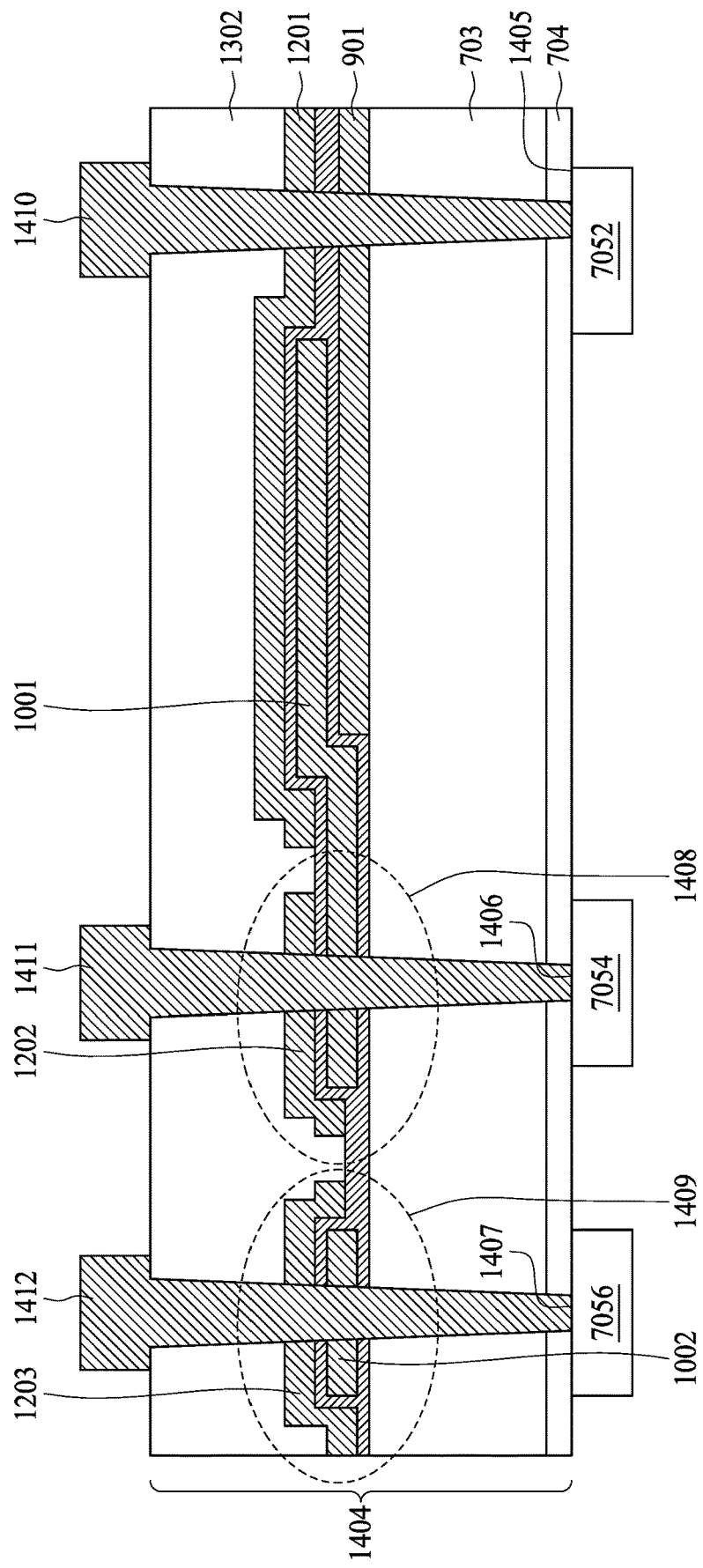

Referring to FIG. 14A and operation 608, a plurality of holes are formed in a dielectric stack. FIG. 14B is a cross-sectional view of a plurality of holes 1401, 1402, and 1403 are formed in a dielectric stack 1404 during fabrication in accordance with some embodiments. In operation 608, an etching operation is performed upon the exposed portions of the oxide layer 1302 in the FIG. 13. The etchant is arranged to etch through the film stacks in the dielectric stack 1404 to form the holes 1401, 1402, and 1403. As the film arrangement inside the dielectric stack 1404 are substantially equal, the etching speeds of forming the holes 1401, 1402, and 1403 are also equal during the etching operation. When the etching operation is stop, the depths h1, h2, and h3 of the holes 1401, 1402, and 1403 are substantially equal. Moreover, by controlling the etching time of the etchant, the bottoms of the holes 1401, 1402, and 1403 may be controlled to just expose the top surfaces 1405, 1406, and 1407 of the top metal lines 7052, 7054, and 7056 respectively. In other words, the etchant may not excessively etch any of the top metal lines 7052, 7054, and 7056 during the forming the holes 1401, 1402, and 1403. Accordingly, one extra dummy TiN plate (i.e. 1202) is formed in the film stack 1408 penetrated by the hole 1402, and two extra dummy TiN plates (i.e. 1203 and 1002) are formed in the film stack 1409 penetrated by the hole 1403.

Referring to FIG. 14B and operation 610, a plurality of conductive vias are formed in a plurality of holes respectively. FIG. 14B is a cross-sectional view of a plurality of conductive vias 1410, 1411, and 1412 are formed in the dielectric stack 1404 during fabrication in accordance with some embodiments. In operation 610, a deposition operation is performed upon the holes 1401, 1402, and 1403 to the conductive vias 1410, 1411, and 1412 respectively. The conductive via 1410 is arranged to electrically connect to the top metal line 7052, and the top plate (i.e. 1201) and bottom plate (i.e. 901) of the TP-MIM capacitor. The conductive via 1411 is arranged to electrically connect to the top metal line 7054, the metal line 1202, and the middle plate (i.e. 1001) of the TP-MIM capacitor. The conductive via 1412 is arranged to electrically connect to the top metal line 7056, the metal plate 1002, and the metal plate 1203.

Figure 15:
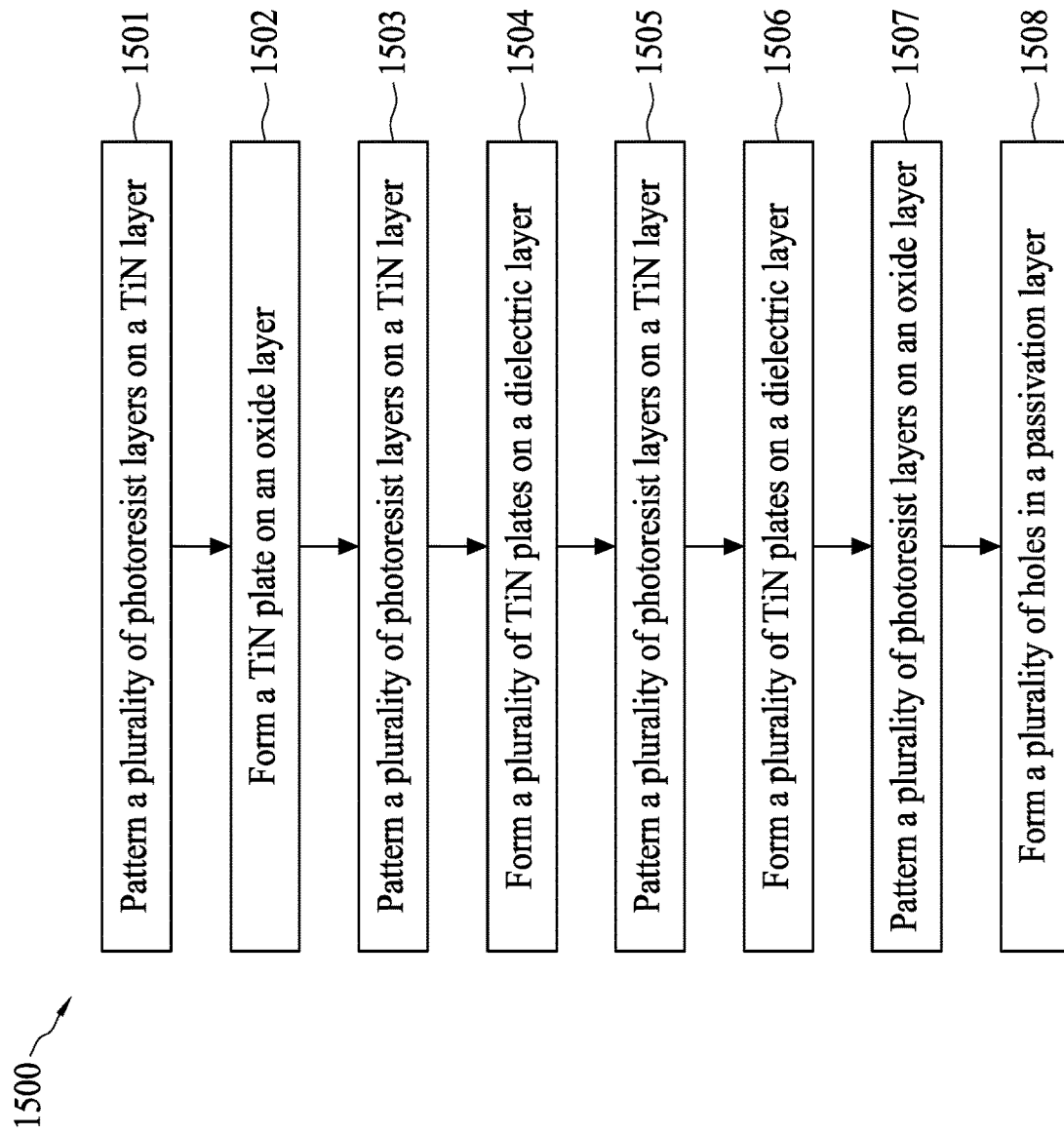
FIG. 15 is a flow diagram illustrating a method of fabricating the semiconductor device of FIG. 3 in accordance with some embodiments.

FIG. 15 is a flow diagram illustrating a method 1500 of fabricating the semiconductor device 300 in accordance with some embodiments. The method 1500 comprises operations 1501-1508. FIGS. 16-23 are diagrams illustrating stages in the fabrication of the semiconductor device 300 in accordance with some embodiments. According to some embodiments, the devices in FIGS. 16-23 correspond to the operations 1501-1508 of the method 1500 respectively. The method 1500 of FIG. 15 is a simplified semiconductor process. Therefore, other steps or operations may be incorporated in the process.

Figure 16:
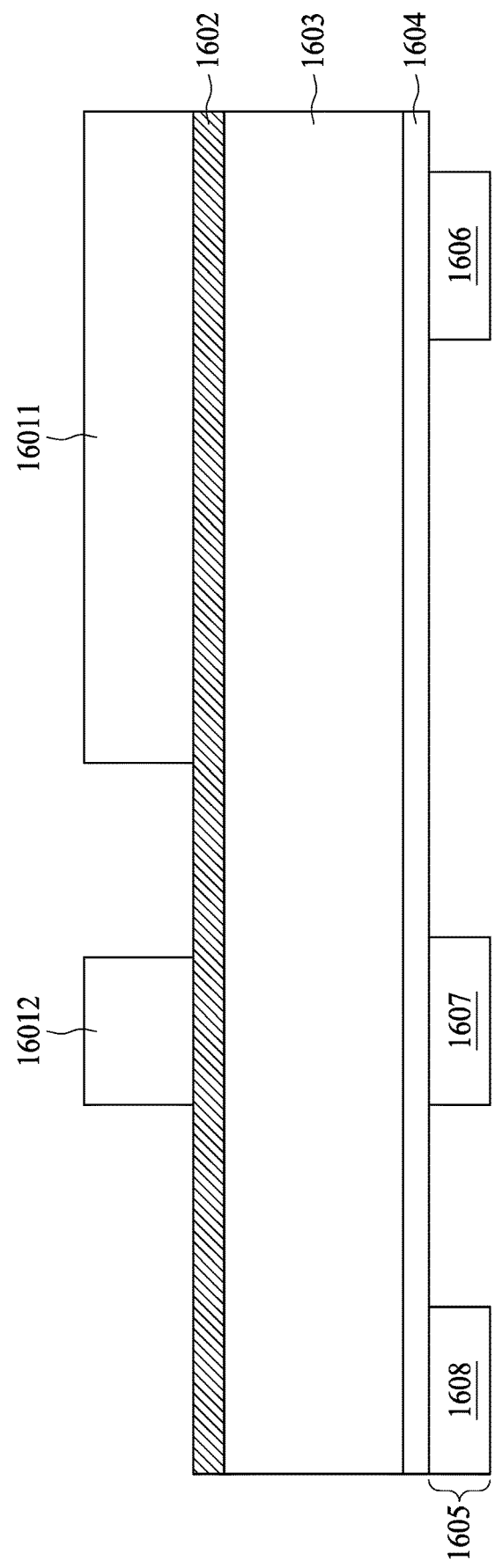
FIGS. 16-23 are diagrams illustrating stages in the fabrication of the semiconductor device of FIG. 3 in accordance with some embodiments.

Referring to FIG. 16 and operation 1501, a plurality of photoresist layers are patterned on a TiN layer. FIG. 16 is a cross-sectional view of a plurality of photoresist layers 16011 and 16012 patterned on a TiN layer 1602 during fabrication in accordance with some embodiments. The TiN layer 1602 is disposed on an oxide layer 1603. The oxide layer 1603 is disposed on an SiN layer 1604. The SiN layer 1604 is disposed on an IC device 1605. For brevity, merely a plurality of top metal lines 1606, 1607, and 1608 of the IC device 1605 are shown in FIG. 16. The metal lines 1606, 1607, and 1608 may be composed of copper.

Figure 17:
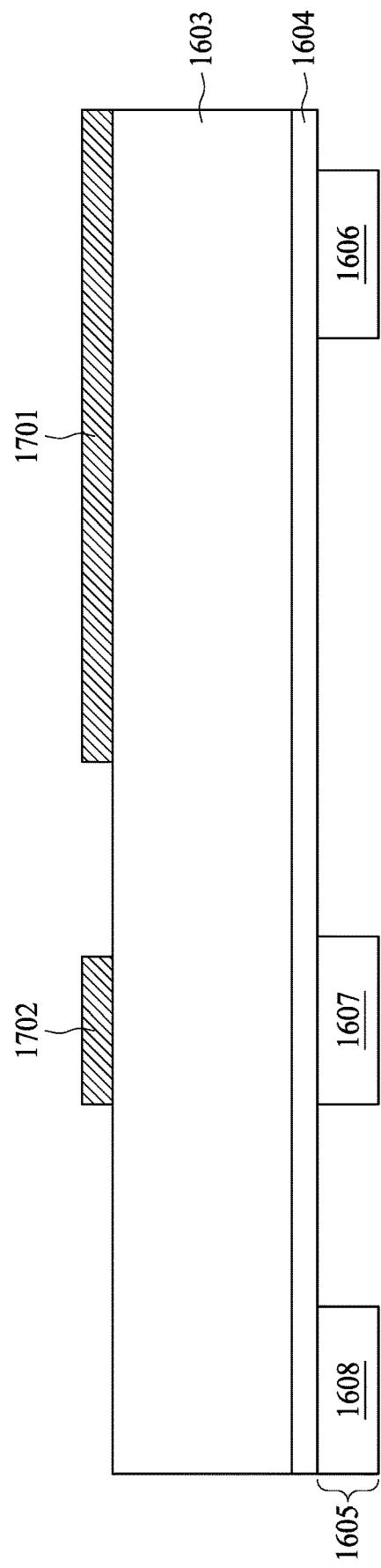

Referring to FIG. 17 and operation 1502, a TiN plate is formed on an oxide layer, e.g., through a deposition operation. FIG. 17 is a cross-sectional view of a plurality of TiN plates 1701 and 1702 formed on the oxide layer 1603 during fabrication in accordance with some embodiments. In operation 1502, the portions of the TiN layer 1602, which are not covered by the photoresist layers 16011 and 16012, are etched, and a bottom metal plate (i.e. the TiN plate 1701) of a TP-MIM capacitor and a dummy metal plate (i.e. the TiN plate 1702) are formed. According to some embodiments, the bottom metal plate (i.e. the TiN plate 1701) and the dummy metal plate (i.e. the TiN plate 1702) are formed at the fabricating process.

Figure 18:
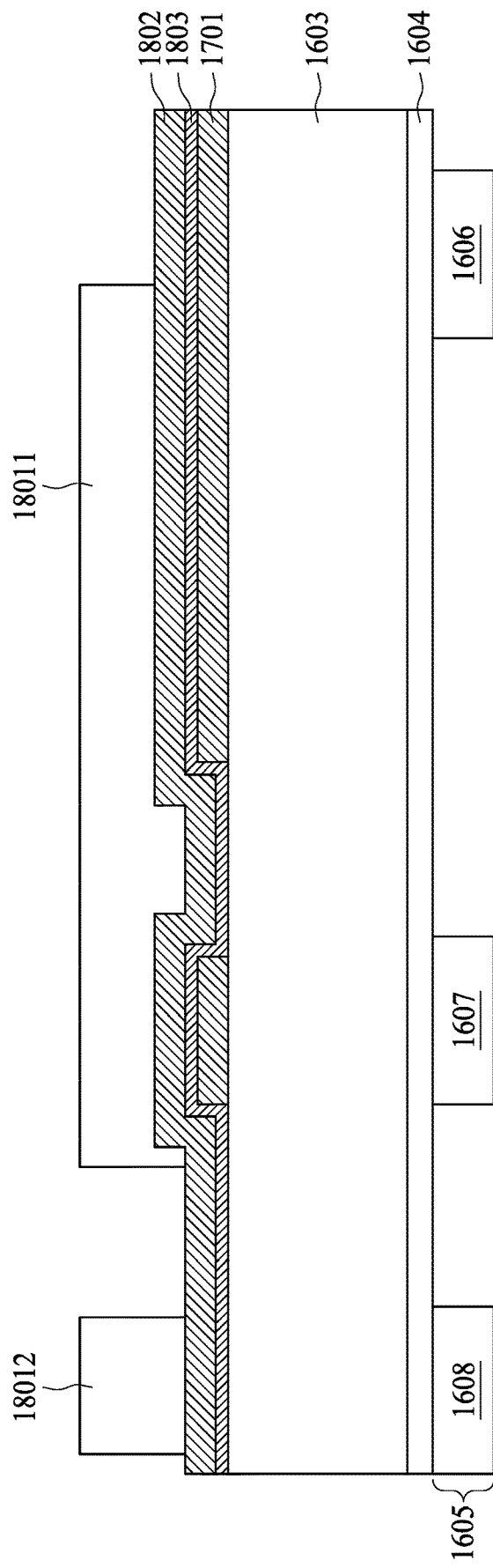

Referring to FIG. 18 and operation 1503, a plurality of photoresist layers are patterned on a TiN layer. FIG. 18 is a cross-sectional view of a plurality of photoresist layers

18011 and 18012 patterned on a TiN layer 1802 during fabrication in accordance with some embodiments. In operation 1503, a dielectric layer 1803 is disposed on the TiN plates 1701, 1702, and the exposed portions of the oxide layer 1603. The TiN layer 1802 is disposed on the dielectric layer 1803. The dielectric layer 1803 may be conformably formed on the TiN plates 1701, 1702, and the exposed portions of the oxide layer 1603, e.g., through a deposition operation. The TiN layer 1802 may be conformably formed on the dielectric layer 1803, e.g., through a deposition operation. The dielectric layer 1803 may be composed of high-k material.

Figure 19:
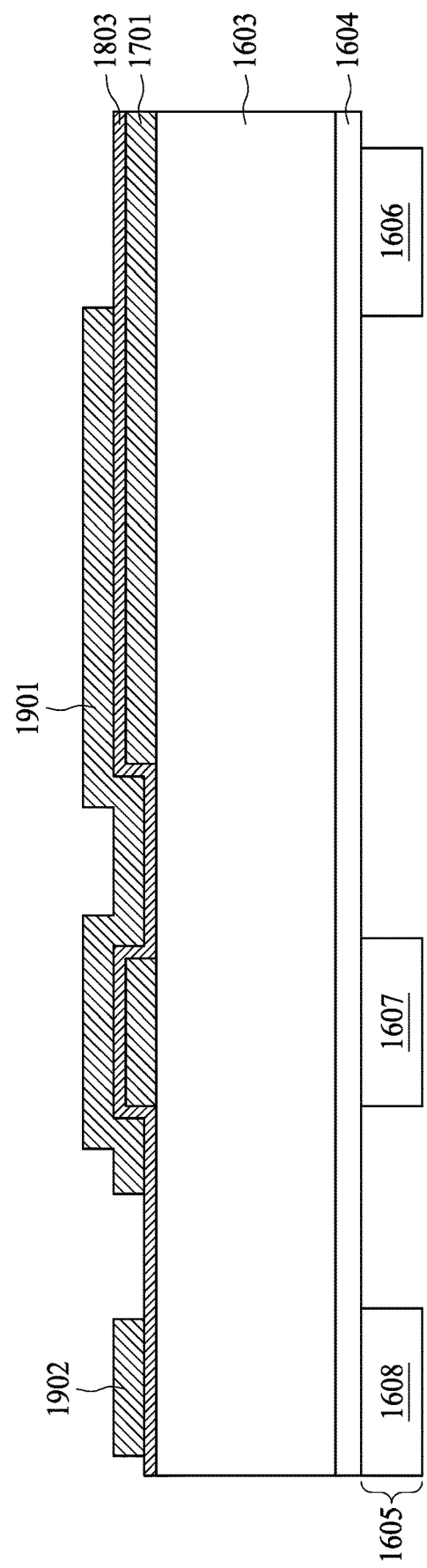

Referring to FIG. 19 and operation 1504, a plurality of TiN plates are formed on a dielectric layer, e.g., through a deposition operation. FIG. 19 is a cross-sectional view of a plurality of TiN plates 1901 and 1902 formed on the dielectric layer 1803 during fabrication in accordance with some embodiments. In operation 1504, the portion of the TiN layer 1802, which are not covered by the photoresist layers 18011 and 18012, are etched, and an intermediate metal plate (i.e. the TiN plate 1901) of the TP-MIM capacitor and a dummy TiN plate (i.e. the TiN plate 1902) are formed. According to some embodiments, the intermediate metal plate (i.e. the TiN plate 1901) and the dummy TiN plate (i.e. the TiN plate 1902) are formed at the fabricating process.

Figure 20:
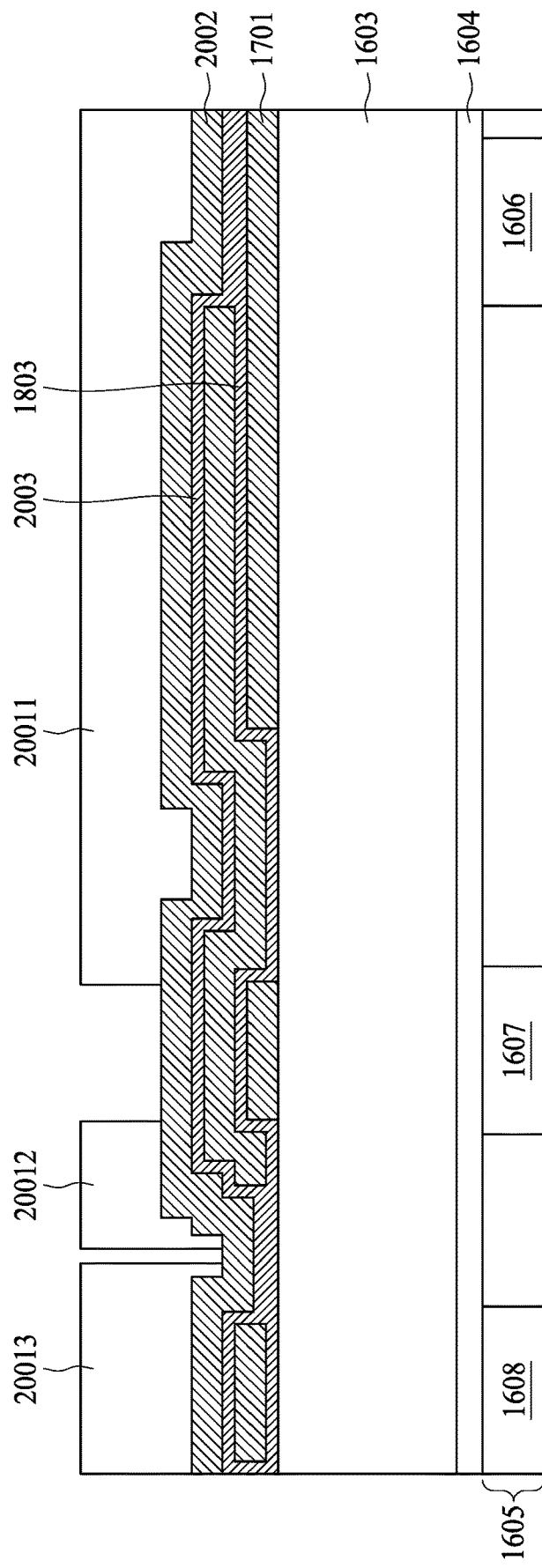

Referring to FIG. 20 and operation 1505, a plurality of photoresist layers are patterned on a TiN plate. FIG. 20 is a cross-sectional view of a plurality of photoresist layers 20011, 20012, and 20013 patterned on a TiN layer 2002 during fabrication in accordance with some embodiments. In operation 1505, a dielectric layer 2003 is disposed on the TiN plates 1901, 1902, and the exposed portions of the dielectric layer 1803, e.g., through a deposition operation. The TiN layer 2002 is disposed on the dielectric layer 2003. The dielectric layer 2003 may be conformably formed on the TiN plates 1901, 1902, and the exposed portions of the dielectric layer 1803. The TiN layer 2002 may be conformably formed on the dielectric layer 2003. The dielectric layer 2003 may be composed of high-k material.

Figure 21:
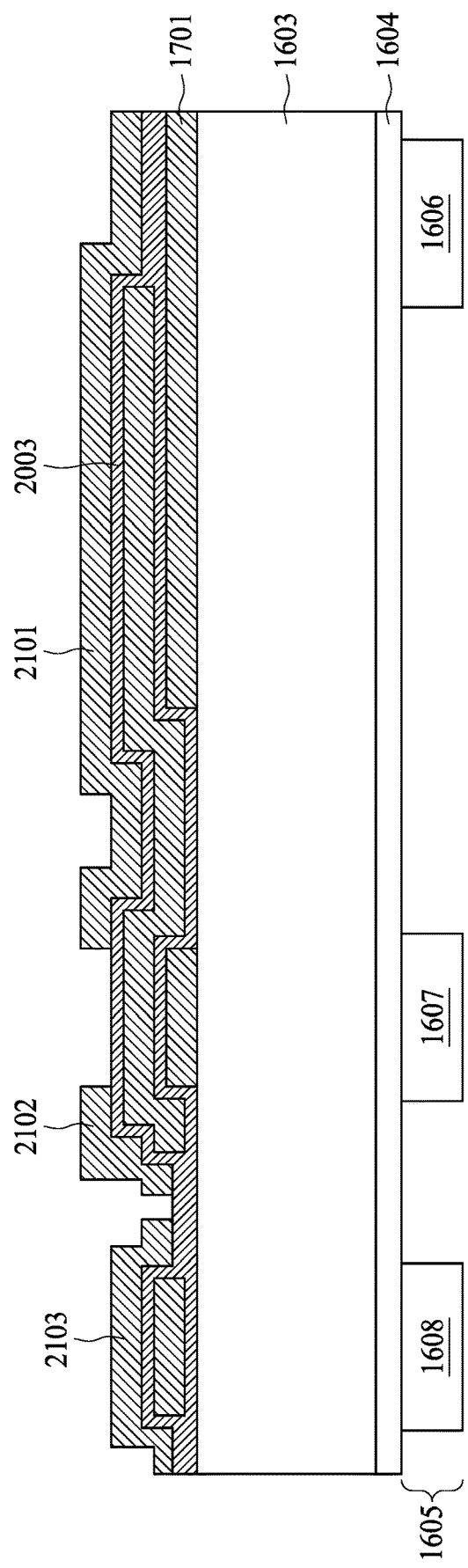

Referring to FIG. 21 and operation 1506, a plurality of TiN plates are formed on a dielectric layer, e.g., through a deposition operation. FIG. 21 is a cross-sectional view of a plurality of TiN plates 2101, 2102, and 2103 formed on the dielectric layer 2003 during fabrication in accordance with some embodiments. In operation 1506, the portions of the TiN layer 2002, which are not covered by the photoresist layers 20011, 20012, and 20013, are etched, and a top metal plate (i.e. the TiN plate 2101) of the TP-MIM capacitor, a first dummy TiN plate (i.e. the TiN plate 2102), and a second dummy TiN plate (i.e. the TiN plate 2103) are formed. According to some embodiments, the top metal plate (i.e. the TiN plate 2101), the first dummy TiN plate (i.e. the TiN plate 2102), and the second dummy TiN plate (i.e. the TiN plate 2103) are formed at the fabricating process.

Figure 22:
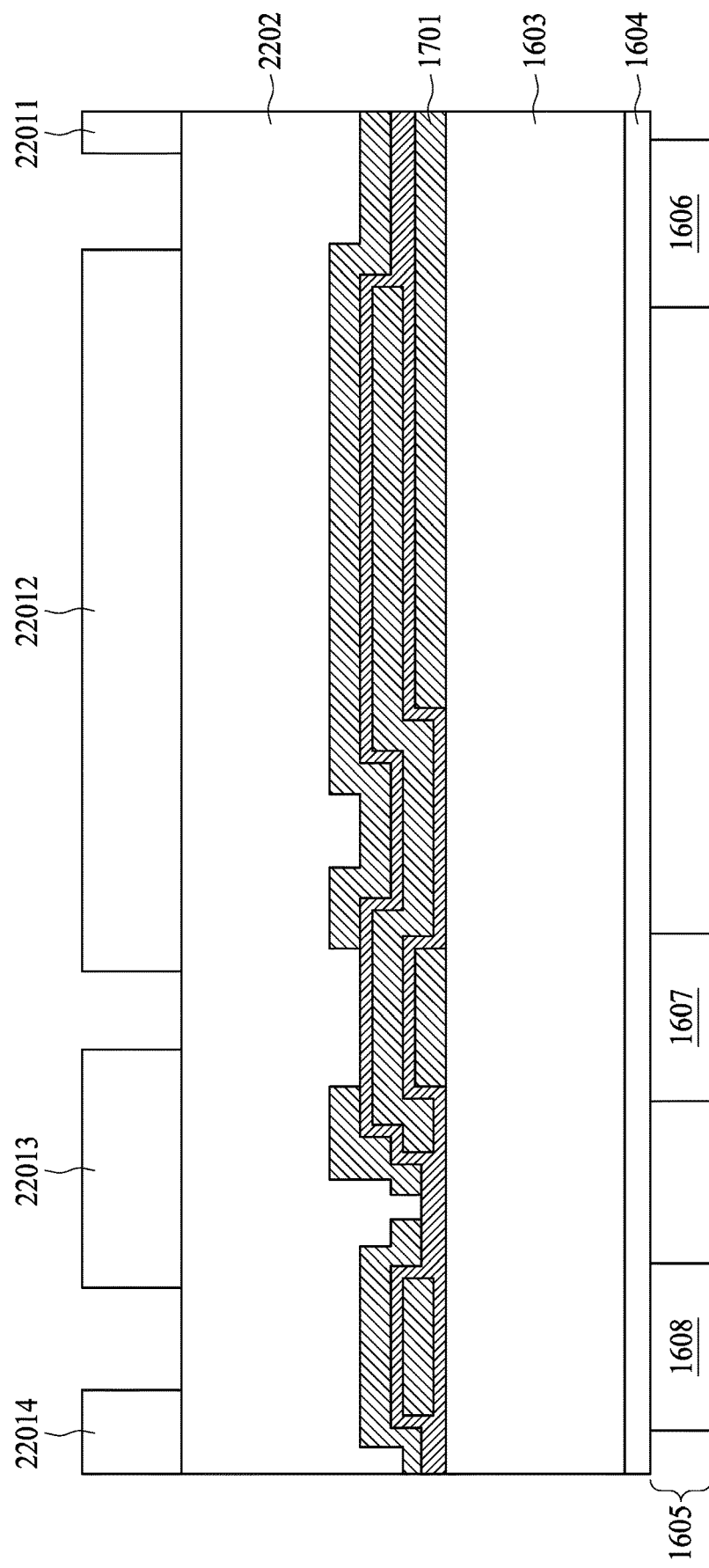

Referring to FIG. 22 and operation 1507, a plurality of photoresist layers are patterned on an oxide layer. FIG. 22 is a cross-sectional view of a plurality of photoresist layers 22011, 22012, 22013, and 22014 patterned on an oxide layer 2202 during fabrication in accordance with some embodiments. In operation 1507, the oxide layer 2202 is disposed on the TiN plates 2101, 2102, 2103, and the exposed portions of the dielectric layer 2003.

Figure 23:
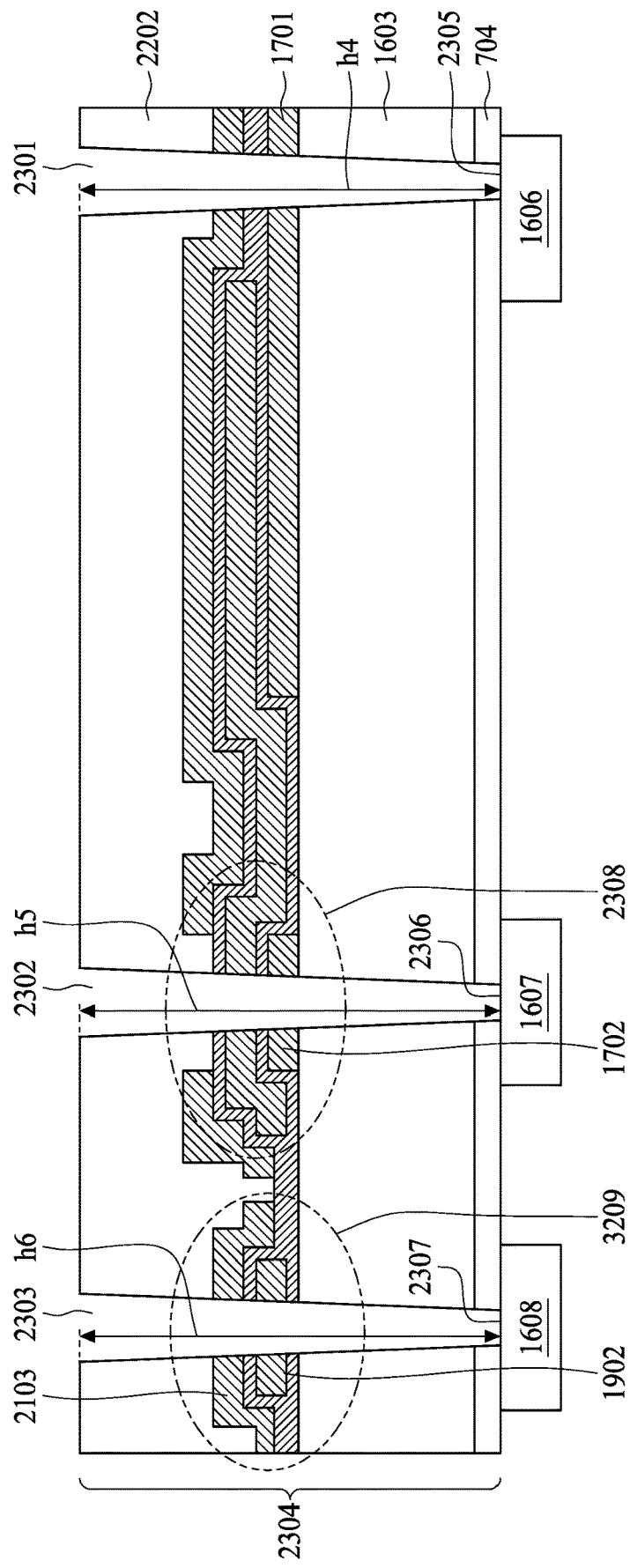

Referring to FIG. 23 and operation 1508, a plurality of holes are formed in a dielectric stack. FIG. 23 is a cross-sectional view of a plurality of holes 2301, 2302, and 2303 are formed in a dielectric stack 2304 during fabrication in accordance with some embodiments. In operation 1508, an etching operation is performed upon the exposed portions of the oxide layer 2202 in the FIG. 22. The etchant is arranged to etch through the film stacks in the dielectric stack 2304 to form the holes 2301, 2302, and 2303. As the film arrangement inside the dielectric stack 2304 are substantially equal, the etching speeds of forming the holes 2301, 2302, and 2303 are also equal during the etching operation. When the etching operation is stop, the depths h4, h5, and h6 of the holes 2301, 2302, and 2303 are substantially equal. Moreover, by controlling the etching time of the etchant, the bottoms of the holes 2301, 2302, and 2303 may be controlled to just expose the top surfaces 2305, 2306, and 2307 of the top metal lines 1606, 1607, and 1608 respectively. In other words, the etchant may not excessively etch any of the top metal lines 1606, 1607, and 1608 during the forming the holes 2301, 2302, and 2303. Accordingly, one extra dummy TiN plate (i.e. 1702) is formed in the film stack 2308 penetrated by the hole 2302, and two extra dummy TiN plates (i.e. 2103 and 1902) are formed in the film stack 2309 penetrated by the hole 2303.

According to some embodiments, a deposition operation may be performed upon the holes 2301, 2302, and 2303 to form a plurality conductive vias respectively. The deposition operation is similar to the operation of FIG. 14B, and the detailed description is omitted here for brevity.

Figure 24:
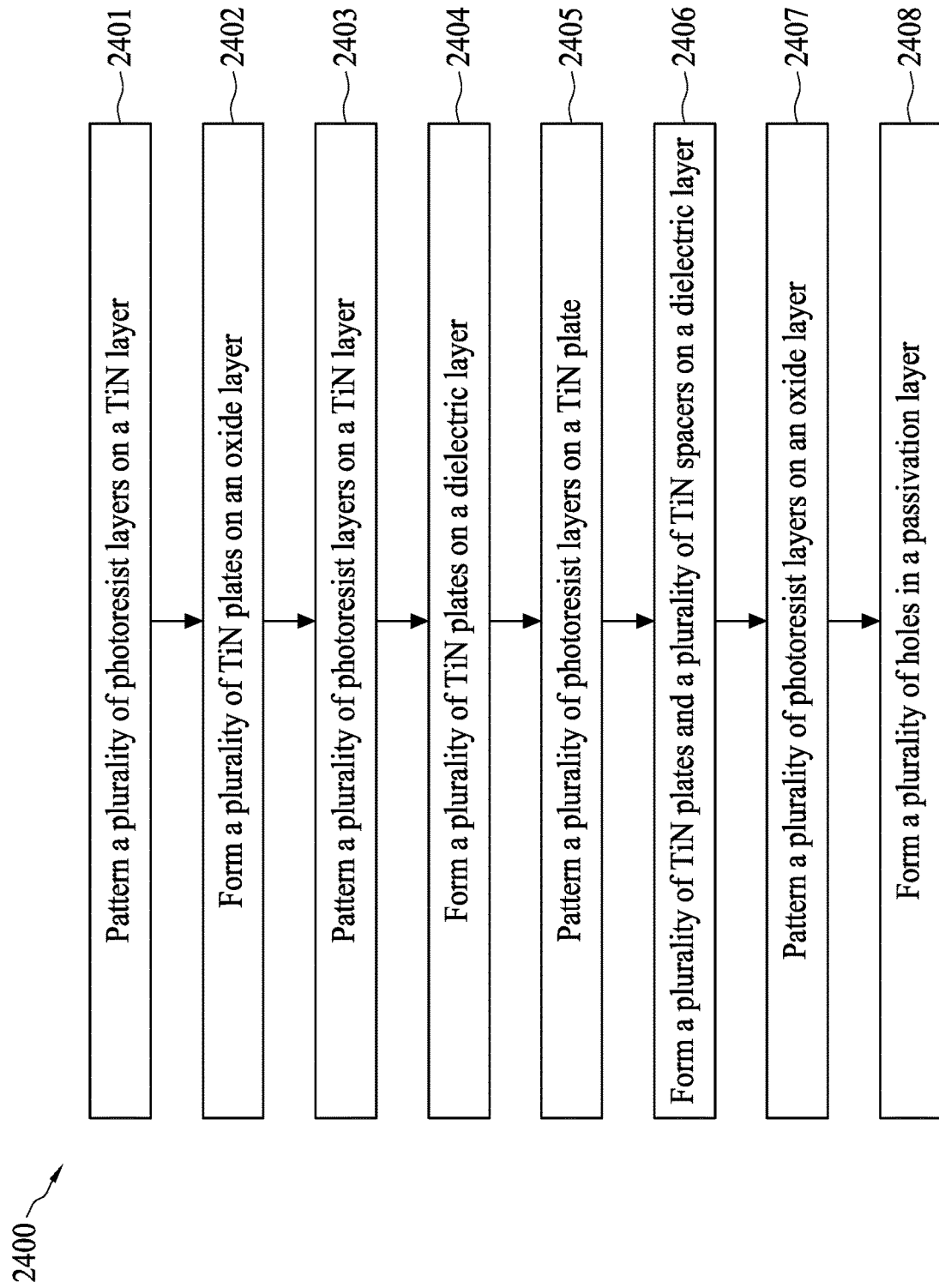
FIG. 24 is a flow diagram illustrating a method of fabricating the semiconductor device of FIG. 4 in accordance with some embodiments.

FIG. 24 is a flow diagram illustrating a method 2400 of fabricating the semiconductor device 400 in accordance with some embodiments. The method 2400 comprises operations 2401-2408. FIGS. 25-32 are diagrams illustrating stages in the fabrication of the semiconductor device 400 in accordance with some embodiments. According to some embodiments, the devices in FIGS. 25-32 correspond to the operations 2401-2408 of the method 2400 respectively. The method 2400 of FIG. 24 is a simplified semiconductor process. Therefore, other steps or operations may be incorporated in the process.

Figure 25:
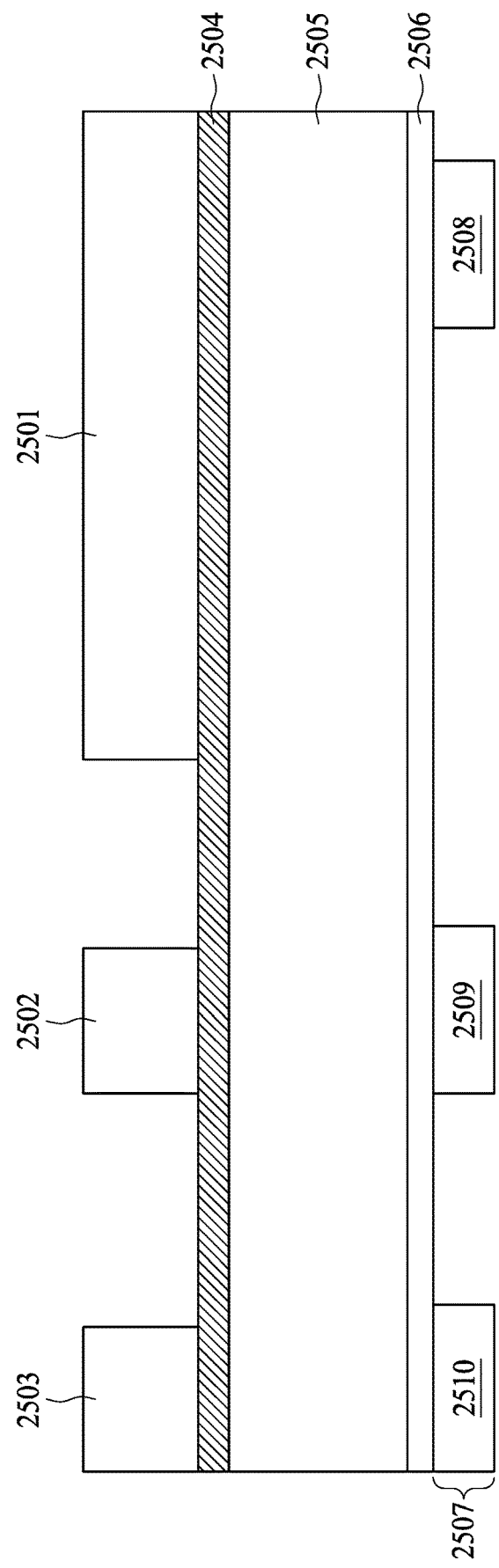
FIGS. 25-32 are diagrams illustrating stages in the fabrication of the semiconductor device of FIG. 4 in accordance with some embodiments.

Referring to FIG. 25 and operation 2401, a plurality of photoresist layers are patterned on a TiN layer. FIG. 25 is a cross-sectional view of a plurality of photoresist layers 2501, 2502, and 2503 patterned on a TiN layer 2504 during fabrication in accordance with some embodiments. The TiN layer 2504 is disposed on an oxide layer 2505. The oxide layer 2505 is disposed on an SiN layer 2506. The SiN layer 2506 is disposed on an IC device 2507. For brevity, merely a plurality of top metal lines 2508, 2509, and 2510 of the IC device 2507 are shown in FIG. 25. The metal lines 2508, 2509, and 2510 may be composed of copper.

Figure 26:
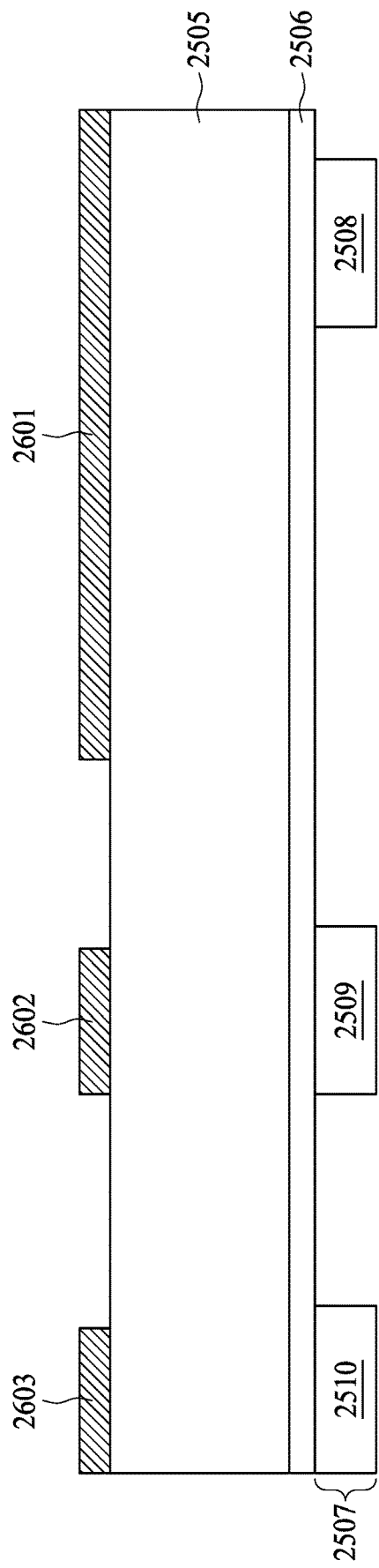

Referring to FIG. 26 and operation 2402, a plurality of TiN plates are formed on an oxide layer, e.g., through a deposition operation. FIG. 26 is a cross-sectional view of a plurality of TiN plates 2601, 2602, and 2603 formed on the oxide layer 2505 during fabrication in accordance with some embodiments. In operation 2402, the portions of the TiN layer 2504, which are not covered by the photoresist layers 2501, 2502, and 2503, are etched, and a bottom metal plate (i.e. the TiN plate 2601) of a TP-MIM capacitor, a first dummy metal plate (i.e. the TiN plate 2602), and a second dummy metal plate (i.e. the TiN plate 2603) are formed. According to some embodiments, the bottom metal plate (i.e. the TiN plate 2601), the first dummy metal plate (i.e. the TiN plate 2602), and the second dummy metal plate (i.e. the TiN plate 2603) are formed at the fabricating process.

Figure 27:
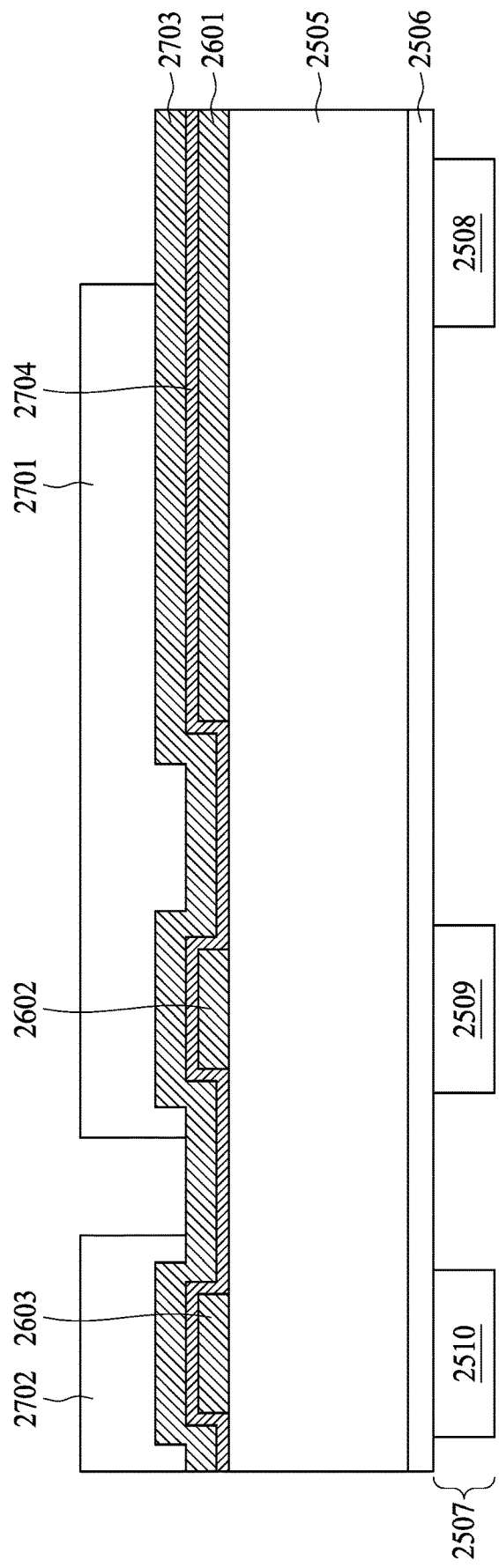

Referring to FIG. 27 and operation 2403, a plurality of photoresist layers are patterned on a TiN layer. FIG. 27 is a cross-sectional view of a plurality of photoresist layers 2701 and 2702 patterned on a TiN layer 2703 during fabrication in accordance with some embodiments. In operation 2403, a dielectric layer 2704 is disposed on the TiN plates 2601, 2602, 2603, and the exposed portions of the oxide layer 2505. The TiN layer 2703 is disposed on the dielectric layer 2704. The dielectric layer 2704 may be conformably formed on the TiN plates 2601, 2602, 2603, and the exposed portions of the oxide layer 2505, e.g., through a deposition operation. The TiN layer 2703 may be conformably formed on the dielectric layer 2704, e.g., through a deposition operation. The dielectric layer 2704 may be composed of high-k material.

Figure 28:
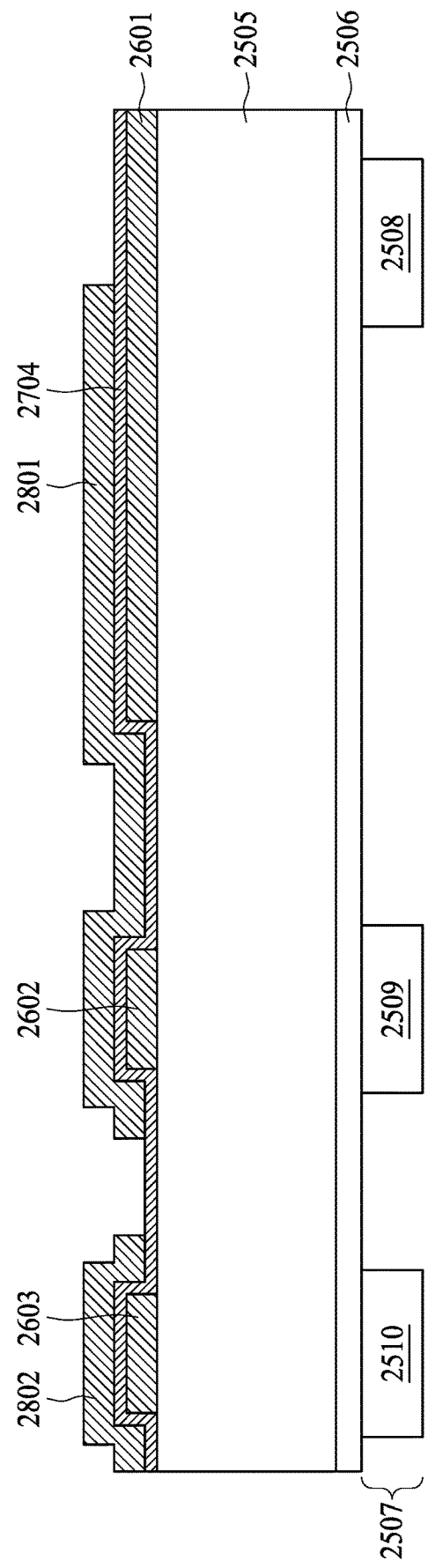

Referring to FIG. 28 and operation 2404, a plurality of TiN plates are formed on a dielectric layer, e.g., through a deposition operation. FIG. 28 is a cross-sectional view of a plurality of TiN plates 2801 and 2802 formed on the dielectric layer 2704 during fabrication in accordance with some embodiments. In operation 2404, the portions of the TiN layer 2703, which are not covered by the photoresist layers 2701 and 2702, are etched, and an intermediate metal plate (i.e. the TiN plate 2801) of the TP-MIM capacitor and a dummy TiN plate (i.e. the TiN plate 2802) are formed. According to some embodiments, the intermediate metal plate (i.e. the TiN plate 2801) and the dummy TiN plate (i.e. the TiN plate 2802) are formed at the fabricating process.

Figure 29:
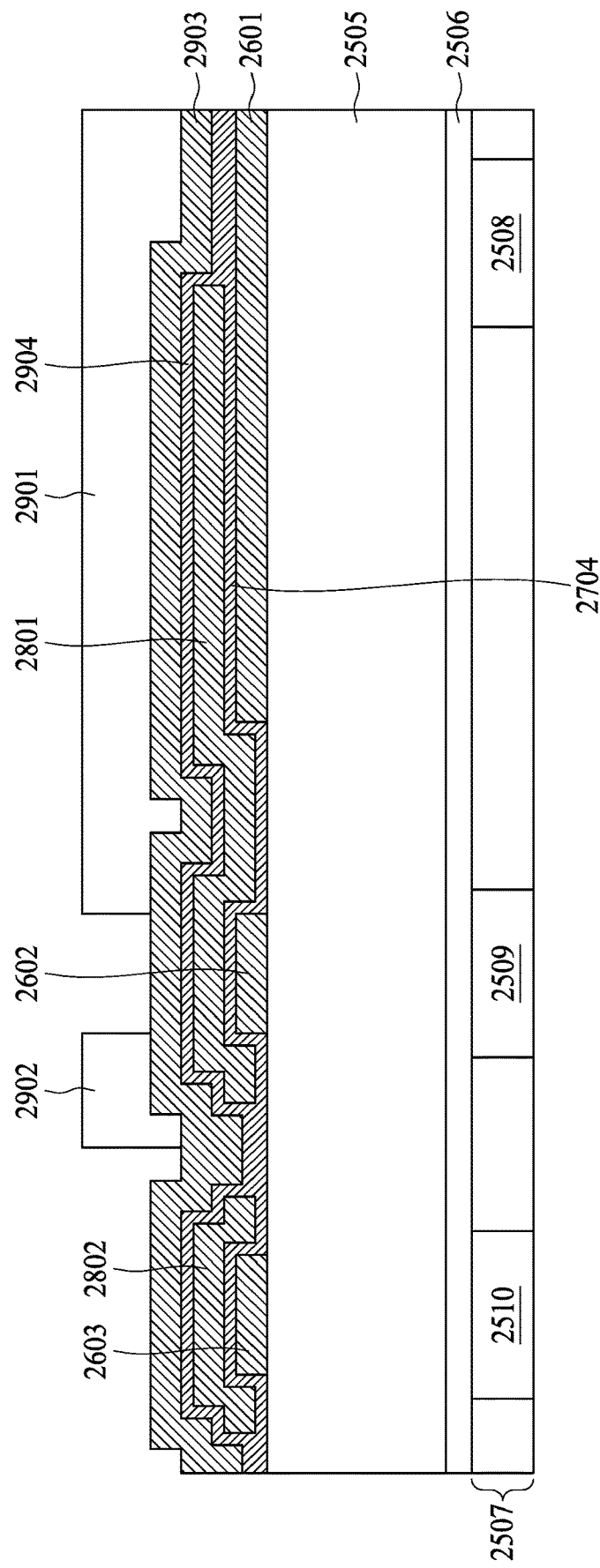

Referring to FIG. 29 and operation 2405, a plurality of photoresist layers are patterned on a TiN plate. FIG. 29 is a cross-sectional view of a plurality of photoresist layers 2901 and 2902 patterned on a TiN layer 2903 during fabrication in accordance with some embodiments. In operation 2405, a dielectric layer 2904 is disposed on the TiN plates 2801, 2802, and the exposed portions of the dielectric layer 2704. The TiN layer 2903 is disposed on the dielectric layer 2904. The dielectric layer 2904 may be conformably formed on the TiN plates 2801, 2802, and the exposed portions of the dielectric layer 2704, e.g., through a deposition operation. The TiN layer 2903 may be conformably formed on the dielectric layer 2904, e.g., through a deposition operation. The dielectric layer 2904 may be composed of high-k material.

Figure 30:
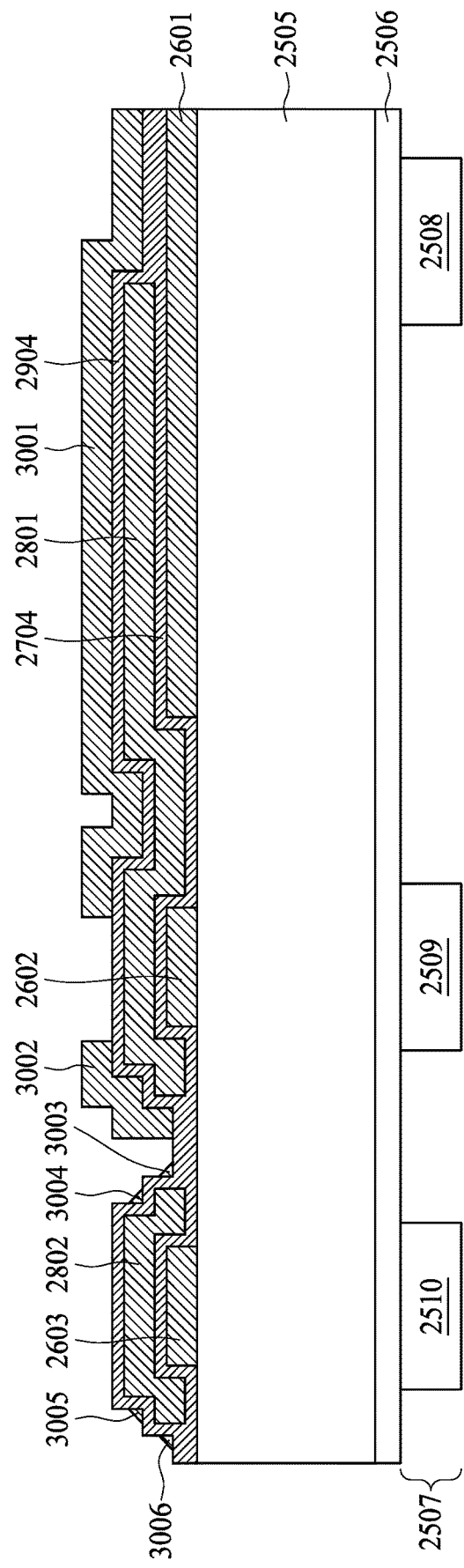

Referring to FIG. 30 and operation 2406, a plurality of TiN plates and a plurality of TiN spacers are formed on a dielectric layer, e.g., through a deposition operation. FIG. 30 is a cross-sectional view of a plurality of TiN plates 3001, 3002, and a plurality of TiN spacers 3003, 3004, 30058, and 3006 formed on the dielectric layer 2904 during fabrication in accordance with some embodiments. In operation 2406, the portions of the TiN layer 2903, which are not covered by the photoresist layers 2901 and 2902, are etched, and a top metal plate (i.e. the TiN plate 3001) of the TP-MIM capacitor, a dummy TiN plate (i.e. the TiN plate 3002), and a plurality of TiN residues (i.e. the TiN spacers 3003, 3004, 3005, and 3006) are formed.

Figure 31:
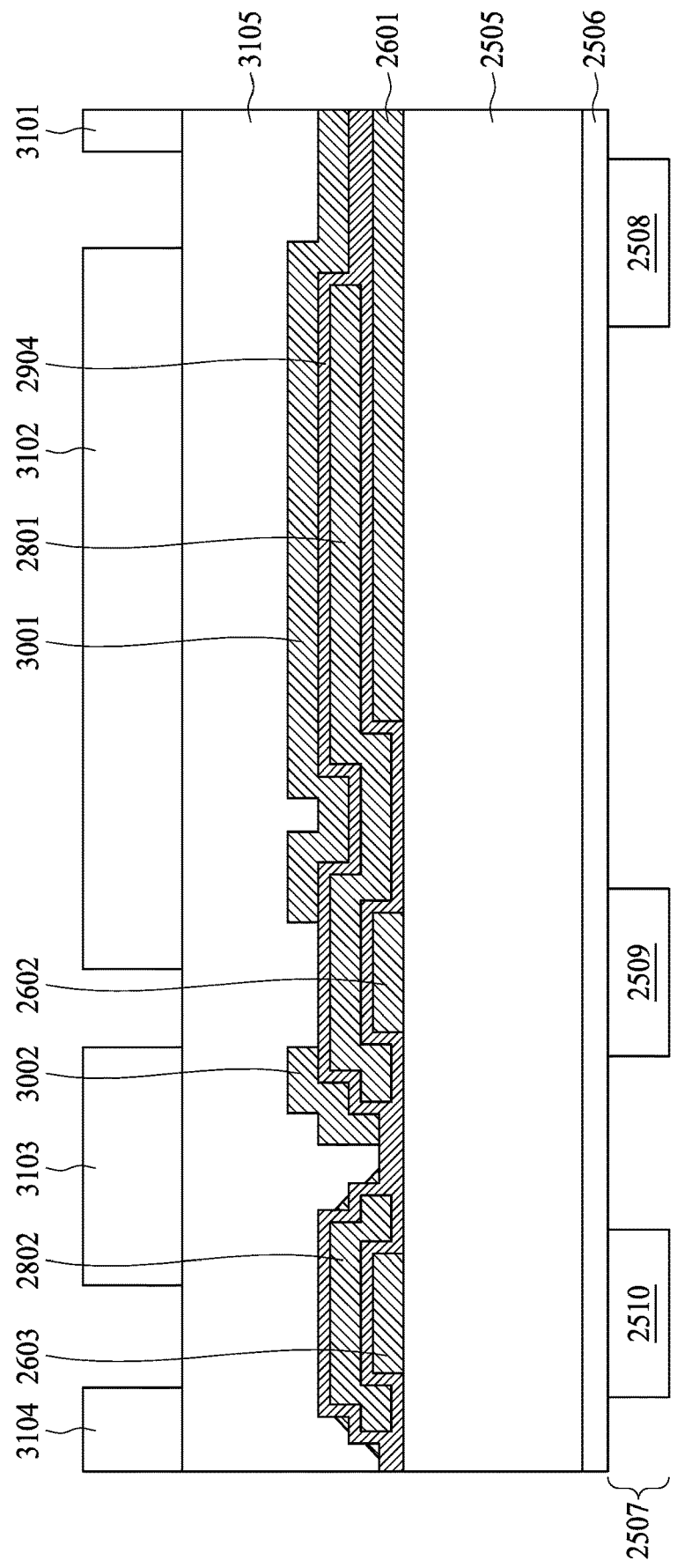

Referring to FIG. 31 and operation 2407, a plurality of photoresist layers are patterned on an oxide layer. FIG. 31 is a cross-sectional view of a plurality of photoresist layers 3101, 3102, 3103, and 3104 patterned on an oxide layer 3105 during fabrication in accordance with some embodiments. In operation 2407, the oxide layer 3105 is disposed on the TiN plates 3001, 3002, the TiN spacers 3003, 3004, 3005, 3006, and the exposed portions of the dielectric layer 2904.

Figure 32:
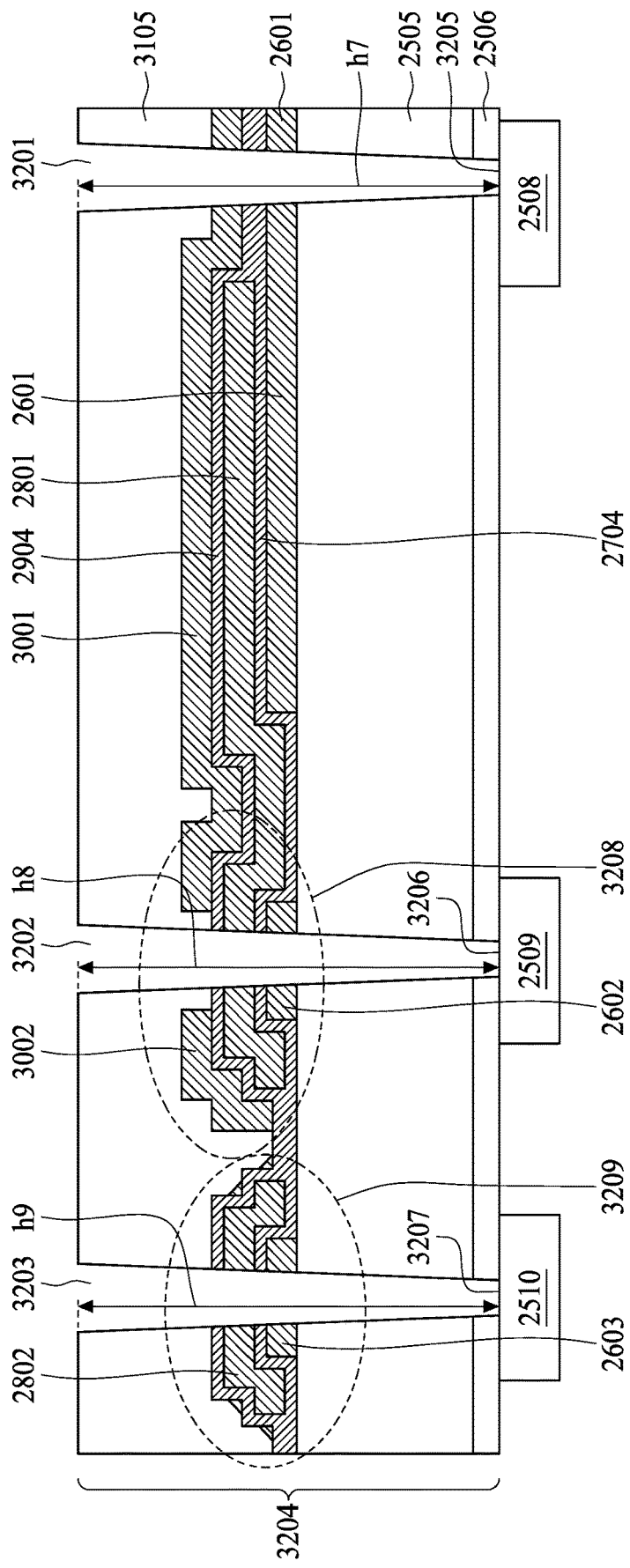

Referring to FIG. 32 and operation 2408, a plurality of holes are formed in a dielectric stack. FIG. 32 is a cross-sectional view of a plurality of holes 3201, 3202, and 3203 are formed in a dielectric stack 3204 during fabrication in accordance with some embodiments. In operation 2408, an etching operation is performed upon the exposed portions of the oxide layer 3105 in the FIG. 31. The etchant is arranged to etch through the film stacks in the dielectric stack 3204 to form the holes 3201, 3202, and 3203. As the film arrangement inside the dielectric stack 3204 are substantially equal, the etching speeds of forming the holes 3201, 3202, and 3203 are also equal during the etching operation. When the etching operation is stop, the depths h7, h8, and h9 of the holes 3201, 3202, and 3203 are substantially equal. Moreover, by controlling the etching time of the etchant, the bottoms of the holes 3201, 3202, and 3203 may be controlled to just expose the top surfaces 3205, 3206, and 3207 of the top metal lines 2508, 2509, and 2510 respectively. In other words, the etchant may not excessively etch any of the top metal lines 2508, 2509, and 2510 during the forming the holes 3201, 3202, and 3203. Accordingly, one extra dummy TiN plate (i.e. 2602) is formed in the film stack 3208 penetrated by the hole 3202, and two extra dummy TiN plates (i.e. 2802 and 2603) are formed in the film stack 3209 penetrated by the hole 3203.

According to some embodiments, a deposition operation may be performed upon the holes 3201, 3202, and 3203 to form a plurality conductive vias respectively. The deposition operation is similar to the operation of FIG. 14B, and the detailed description is omitted here for brevity.

Figure 33:
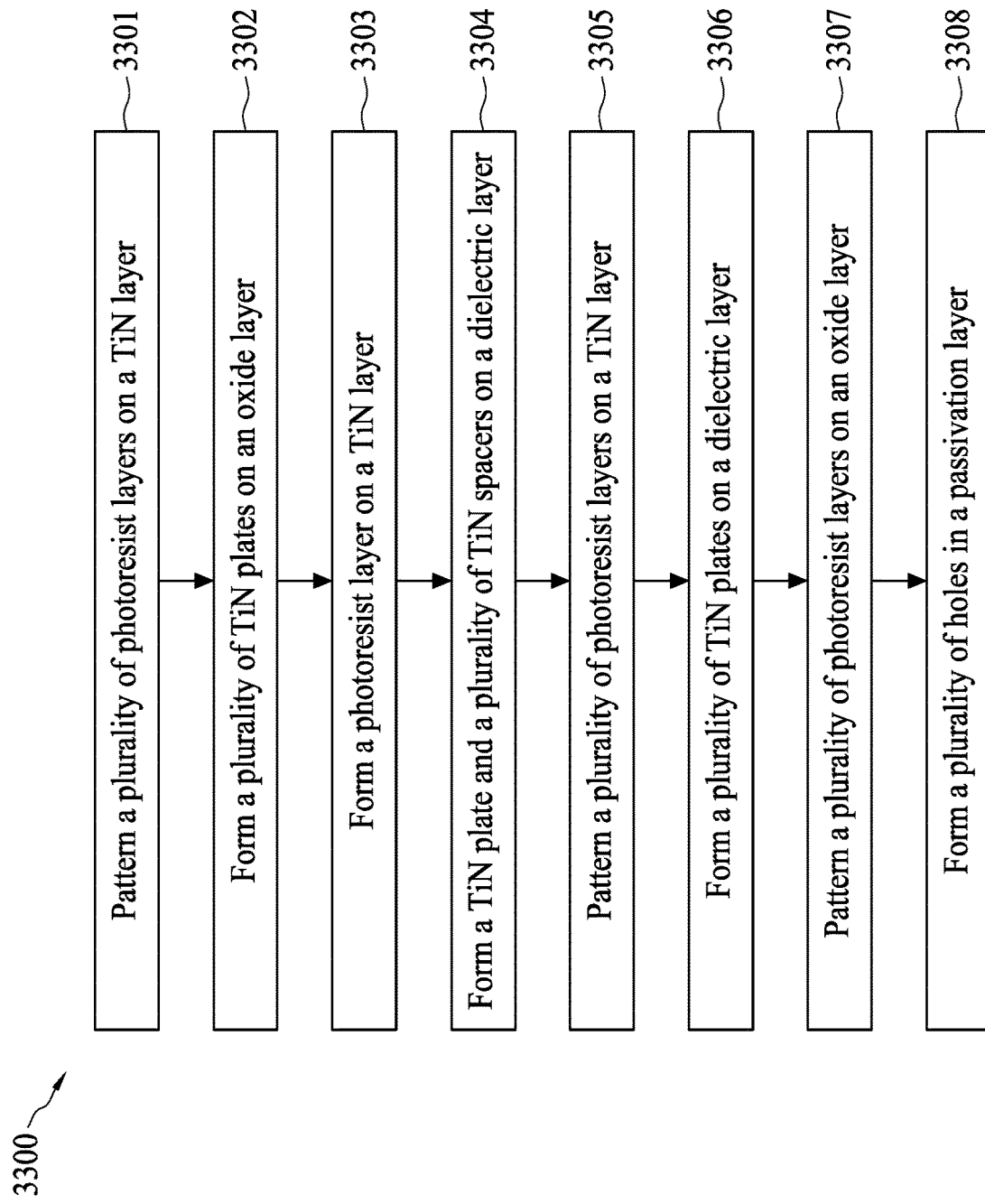
FIG. 33 is a flow diagram illustrating a method of fabricating the semiconductor device of FIG. 5 in accordance with some embodiments.

FIG. 33 is a flow diagram illustrating a method 3300 of fabricating the semiconductor device 500 in accordance with some embodiments. The method 3300 comprises operations 3301-3308. FIGS. 34-41 are diagrams illustrating stages in the fabrication of the semiconductor device 500 in accordance with some embodiments. According to some embodiments, the devices in FIGS. 34-41 correspond to the operations 3301-3308 of the method 3300 respectively. The method 3300 of FIG. 33 is a simplified semiconductor process. Therefore, other steps or operations may be incorporated in the process.

Figure 34:
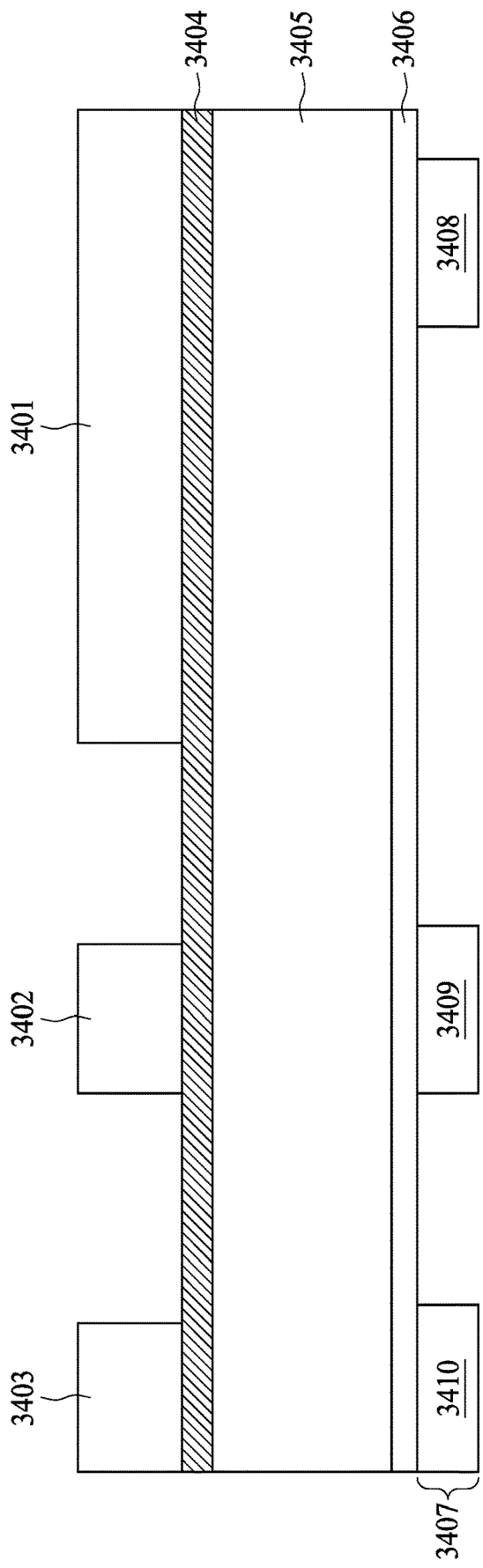
FIGS. 34-41 are diagrams illustrating stages in the fabrication of the semiconductor device of FIG. 5 in accordance with some embodiments.

Referring to FIG. 34 and operation 3301, a plurality of photoresist layers are patterned on a TiN layer. FIG. 34 is a cross-sectional view of a plurality of photoresist layers 3401, 3402, and 3403 patterned on a TiN layer 3404 during fabrication in accordance with some embodiments. The TiN layer 3404 is disposed on an oxide layer 3405. The oxide layer 3405 is disposed on an SiN layer 3406. The SiN layer 3406 is disposed on an IC device 3407. For brevity, merely a plurality of top metal lines 3408, 3409, and 3410 of the IC device 3407 are shown in FIG. 34. The metal lines 3408, 3409, and 3410 may be composed of copper.

Figure 35:
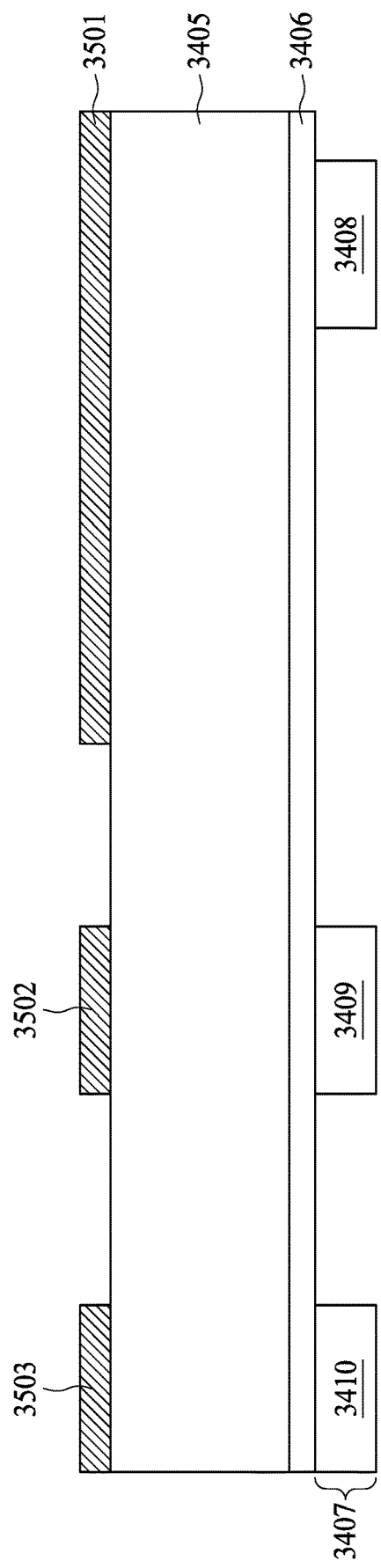

Referring to FIG. 35 and operation 3302, a plurality of TiN plates are formed on an oxide layer, e.g., through a deposition operation. FIG. 35 is a cross-sectional view of a plurality of TiN plates 3501, 3502, and 3503 formed on the oxide layer 3405 during fabrication in accordance with some embodiments. In operation 3302, the portions of the TiN layer 3404, which are not covered by the photoresist layers 3401, 3402, and 3403, are etched, and a bottom metal plate (i.e. the TiN plate 3501) of a TP-MIM capacitor, a first dummy metal plate (i.e. the TiN plate 3502), and a second dummy metal plate (i.e. the TiN plate 3503) are formed. According to some embodiments, the bottom metal plate (i.e. the TiN plate 3501), the first dummy metal plate (i.e. the TiN plate 3502), and the second dummy metal plate (i.e. the TiN plate 3503) are formed at the fabricating process.

Figure 36:
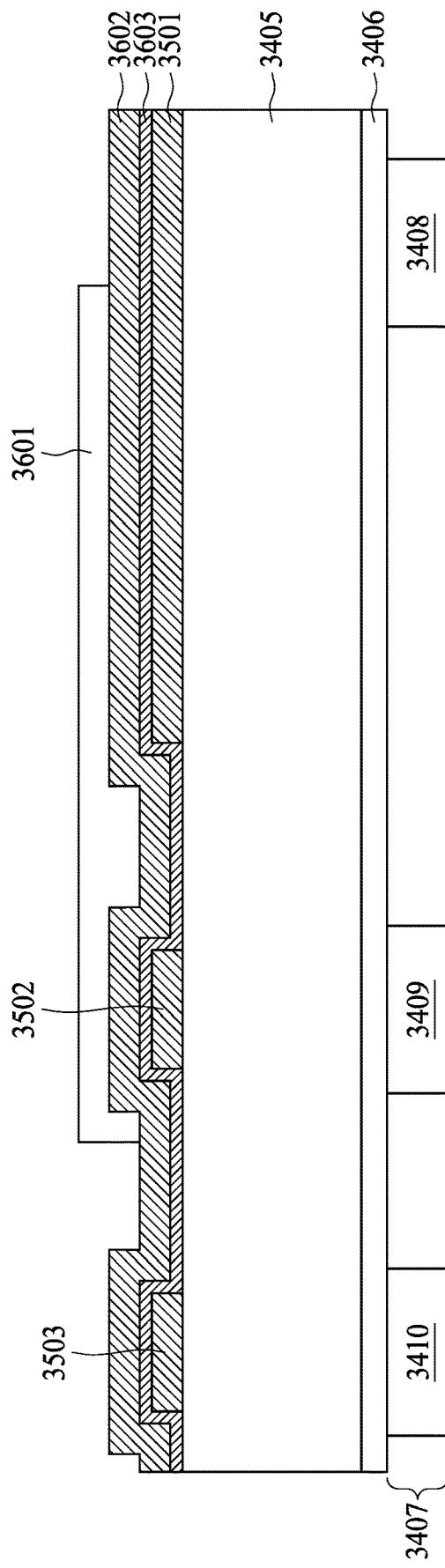

Referring to FIG. 36 and operation 3303, a photoresist layer is patterned on a TiN layer. FIG. 36 is a cross-sectional view of a photoresist layer 3601 patterned on a TiN layer 3601 during fabrication in accordance with some embodiments. In operation 3303, a dielectric layer 3603 is disposed on the TiN plates 3501, 3502, 3503, and the exposed portions of the oxide layer 3405. The TiN layer 3602 is disposed on the dielectric layer 3603. The dielectric layer 3603 may be conformably formed on the TiN plates 3501, 3502, 3503, and the exposed portions of the oxide layer 3405. The TiN layer 3602 may be conformably formed on the dielectric layer 3603, e.g., through a deposition operation. The dielectric layer 3603 may be composed of high-k material.

Figure 37:
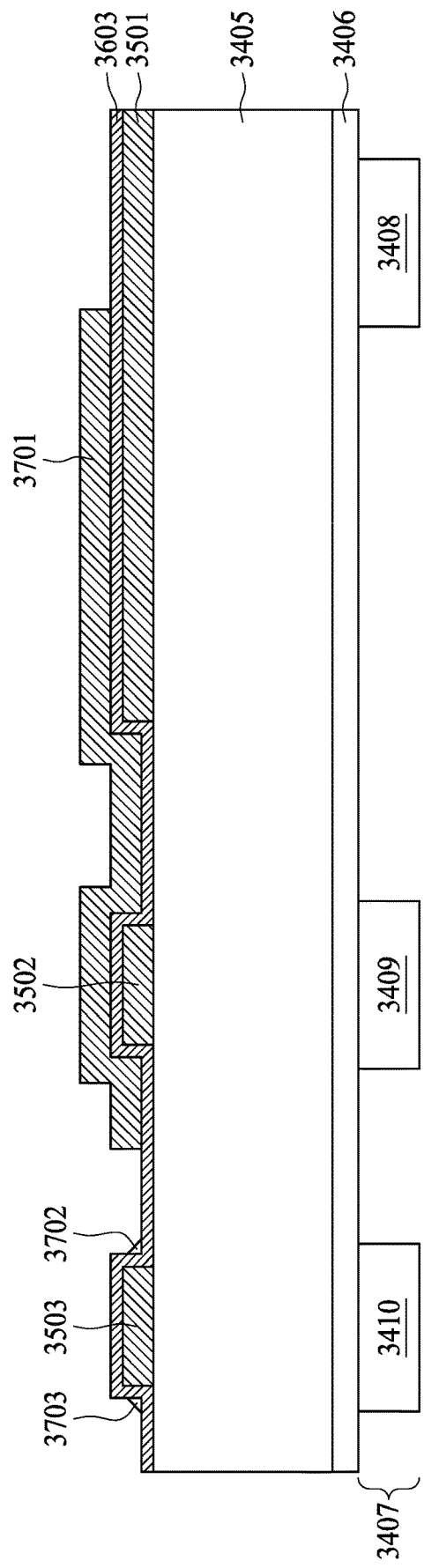

Referring to FIG. 37 and operation 3304, a TiN plate and a plurality of TiN spacers are formed on a dielectric layer, e.g., through a deposition operation. FIG. 37 is a cross-sectional view of a TiN plate 3701 and a plurality of TiN spacers 3702 and 3703 formed on the dielectric layer 3603 during fabrication in accordance with some embodiments. In operation 3304, the portion of the TiN layer 3602, which is not covered by the photoresist layer 3601, is etched, and an intermediate metal plate (i.e. the TiN plate 3701) of the TP-MIM capacitor and a plurality of TiN residues (i.e. the TiN spacers 3702 and 3703) are formed.

Figure 38:
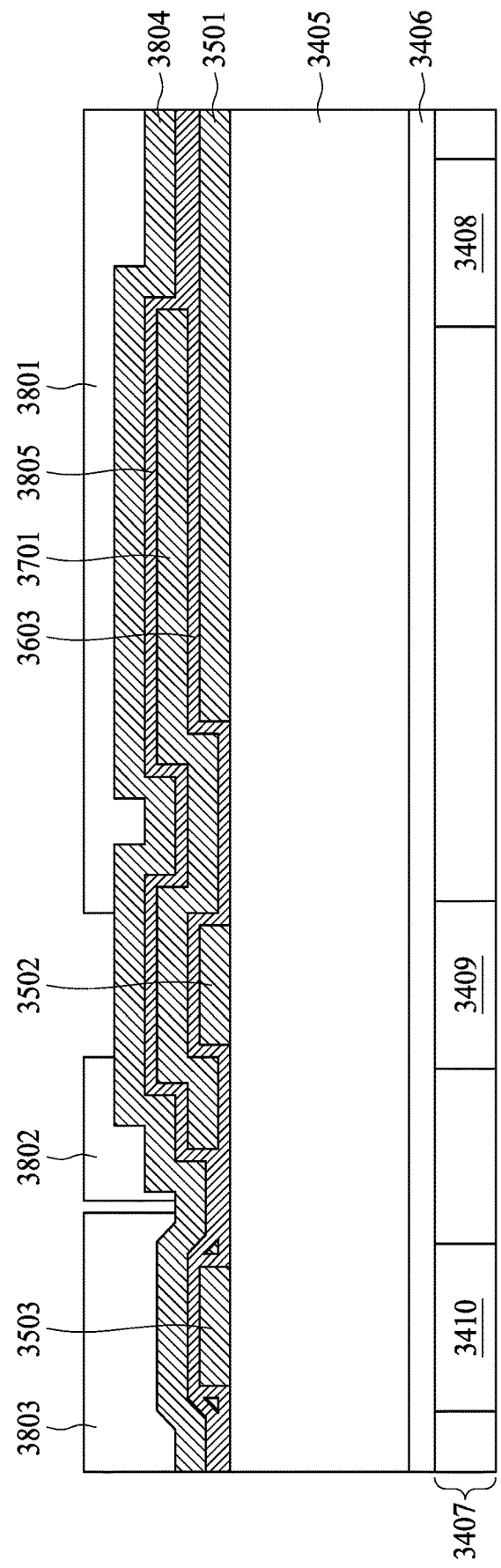

Referring to FIG. 38 and operation 3305, a plurality of photoresist layers are patterned on a TiN plate. FIG. 38 is a cross-sectional view of a plurality of photoresist layers 3801, 3802, and 3803 patterned on a TiN layer 3804 during fabrication in accordance with some embodiments. In operation 3305, a dielectric layer 3805 is disposed on the TiN plate 3701, the TiN spacers 3702 and 3703, and the exposed portions of the dielectric layer 3603. The TiN layer 3804 is disposed on the dielectric layer 3805. The dielectric layer 3805 may be conformably formed on the TiN plate 3701, the TiN spacers 3702 and 3703, and the exposed portions of the dielectric layer 3603. The TiN layer 3804 may be conformably formed on the dielectric layer 3805. The dielectric layer 3805 may be composed of high-k material.

Figure 39:
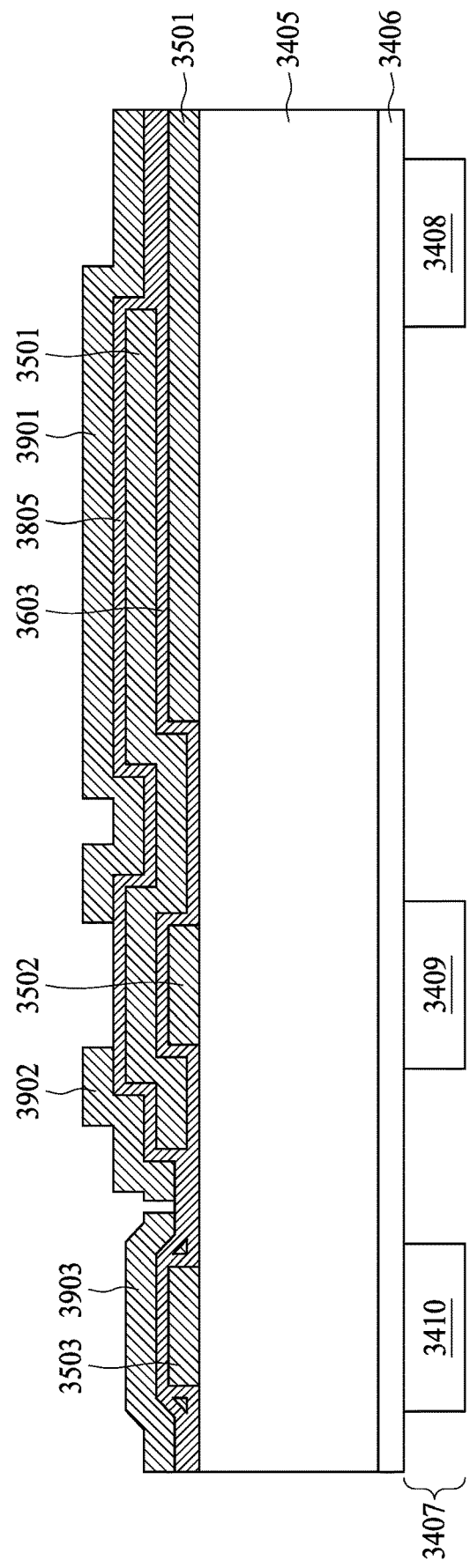

Referring to FIG. 39 and operation 3306, a plurality of TiN plates are formed on a dielectric layer. FIG. 39 is a cross-sectional view of a plurality of TiN plates 3901, 3902, and 3903 formed on the dielectric layer 3805, e.g., through a deposition operation, during fabrication in accordance with some embodiments. In operation 3306, the portions of the TiN layer 3804, which are not covered by the photoresist layers 3801, 3802, and 3803, are etched, and a top metal plate (i.e. the TiN plate 3901) of the TP-MIM capacitor, a first dummy TiN plate (i.e. the TiN plate 3902), and a second dummy TiN plate (i.e. the TiN plate 3903) are formed. According to some embodiments, the top metal plate (i.e. the TiN plate 3901), the first dummy TiN plate (i.e. the TiN plate 3902), and the second dummy TiN plate (i.e. the TiN plate 3903) are formed at the fabricating process.

Figure 40:
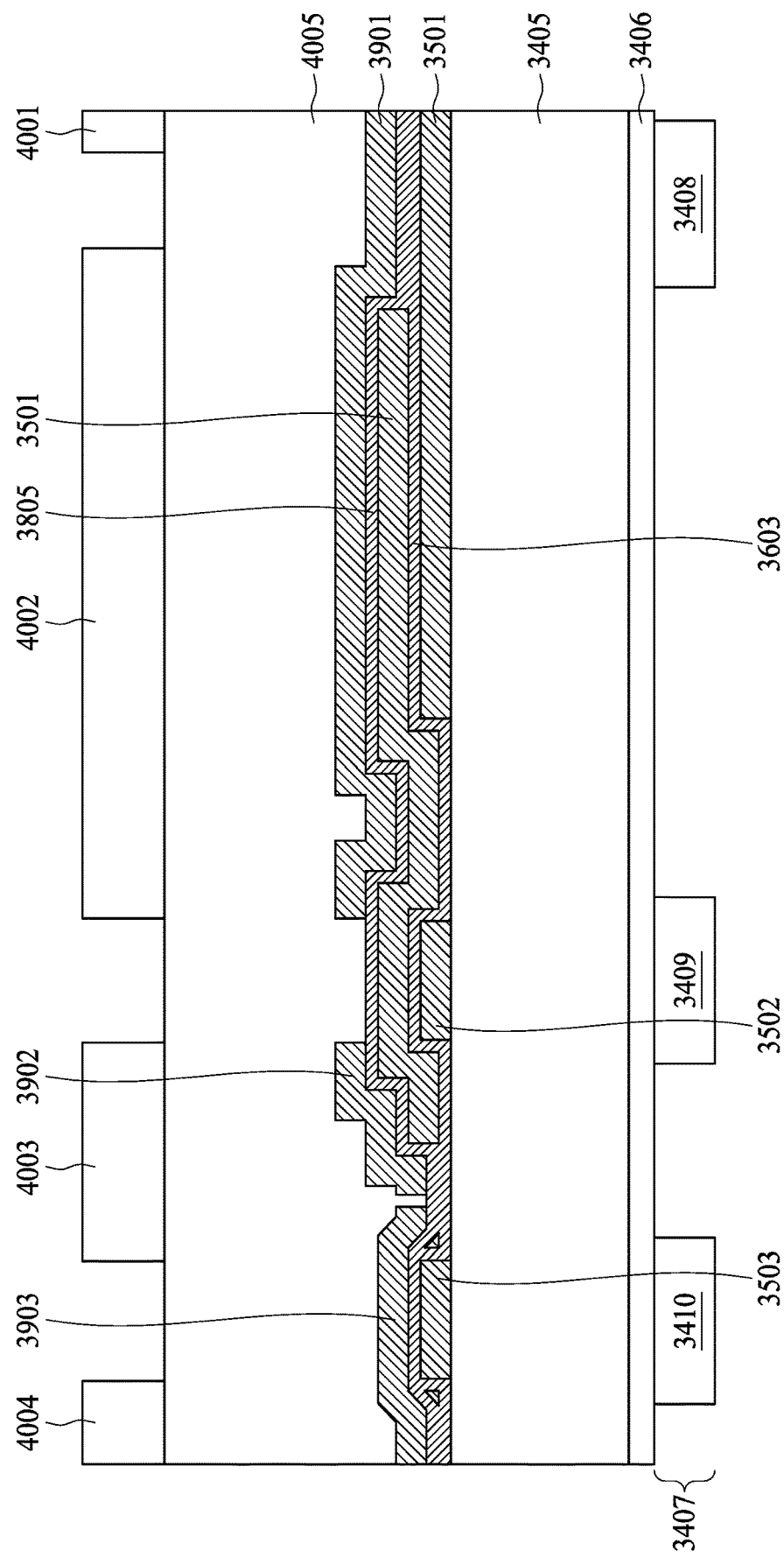

Referring to FIG. 40 and operation 3307, a plurality of photoresist layers are patterned on an oxide layer. FIG. 40 is a cross-sectional view of a plurality of photoresist layers 4001, 4002, 4003, and 4004 patterned on an oxide layer 4005 during fabrication in accordance with some embodiments. In operation 3307, the oxide layer 4005 is disposed on the TiN plates 3901, 3902, and 3903, and the exposed portions of the dielectric layer 3805.

Figure 41:
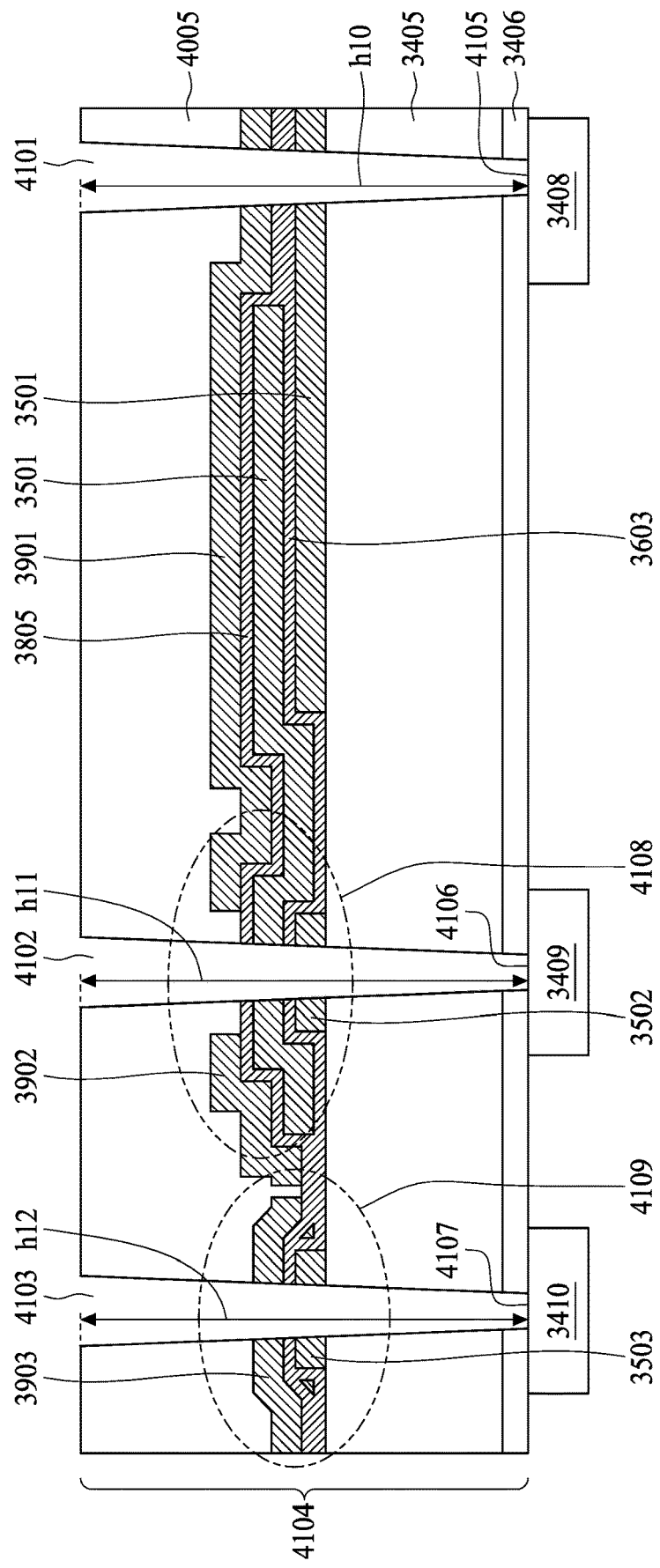

Referring to FIG. 41 and operation 3308, a plurality of holes are formed in a dielectric stack. FIG. 41 is a cross-sectional view of a plurality of holes 4101, 4102, and 4103 are formed in a dielectric stack 4104 during fabrication in accordance with some embodiments. In operation 3308, an etching operation is performed upon the exposed portions of the oxide layer 4005 in the FIG. 40. The etchant is arranged to etch through the film stacks in the dielectric stack 4104 to form the holes 4101, 4102, and 4103. As the film arrangement inside the dielectric stack 4104 are substantially equal, the etching speeds of forming the holes 4101, 4102, and 4103 are also equal during the etching operation. When the etching operation is stop, the depths h10, h11, and h12 of the holes 4101, 4102, and 4103 are substantially equal. Moreover, by controlling the etching time of the etchant, the bottoms of the holes 4101, 4102, and 4103 may be controlled to just expose the top surfaces 4105, 4106, and 4107 of the top metal lines 3408, 3409, and 3410 respectively. In other words, the etchant may not excessively etch any of the top metal lines 3408, 3409, and 3410 during the forming the holes 4101, 4102, and 4103. Accordingly, one extra dummy TiN plate (i.e. 3502) is formed in the film stack 4108 penetrated by the hole 4102, and two extra dummy TiN plates (i.e. 3903 and 3503) are formed in the film stack 4109 penetrated by the hole 4103.

According to some embodiments, a deposition operation may be performed upon the holes 4101, 4102, and 4103 to form a plurality conductive vias respectively. The deposition operation is similar to the operation of FIG. 14B, and the detailed description is omitted here for brevity.

Briefly, by using the proposed methods, the film stacks penetrated by the vias of the logic circuit and the TP-MIM capacitor are substantially equal. During the forming of the holes corresponding to the vias, the etchant is arranged to etch through the same amount of films. Therefore, the bottoms of all holes may be controlled to stop on the top surfaces of the corresponding metal lines in the IC circuit, and the metal line damage due to the excessive etch may be alleviated.

According to some embodiments, a semiconductor device is provided. The semiconductor device comprises a capacitive device, a first conductive via, and a second conductive via. The capacitive device comprises a first conductive plate, a first insulating plate, a second conductive plate, a second insulating plate, and a third conductive plate. The first insulating plate is disposed on the first conductive plate. The second conductive plate is disposed on the first insulating plate. The second insulating plate is disposed on the second conductive plate. The third conductive plate is disposed on the second insulating plate. The first conductive via is electrically coupled to the first conductive plate and the third conductive plate, and the first conductive via penetrated through a first film stack with a first thickness. The second conductive via is electrically coupled to the second conductive plate, and the second conductive via penetrated through a second film stack with a second thickness. The second thickness is substantially equal to the first thickness.

According to some embodiments, a method of forming a semiconductor device is provided. The method comprises: depositing a first conductive plate; depositing a first insulating plate on the first conductive plate; depositing a second conductive plate on the first insulating plate; depositing a second insulating plate on the second conductive plate; depositing a third conductive plate on the second insulating plate; depositing a fourth conductive plate on the second insulating plate; forming a first conductive via penetrating the third conductive plate, the second insulating plate, the first insulating plate, and the first conductive plate, wherein the first conductive via is electrically coupled to the third conductive plate and the first conductive plate; and forming a second conductive via penetrating the fourth conductive plate, the second insulating plate, the second conductive plate, and the first insulating plate, wherein the second conductive via is electrically coupled to the fourth conductive plate and the second conductive plate.

According to some embodiments, a method of forming a semiconductor device is provided. The method comprises: depositing a first conductive plate and a second conductive plate; depositing a first insulating plate on the first conductive plate and the second conductive plate; depositing a third conductive plate on the first insulating plate; depositing a second insulating plate on the third conductive plate; depositing a fourth conductive plate on the second insulating plate; forming a first conductive via penetrating the fourth conductive plate, the second insulating plate, the first insulating plate, and the first conductive plate, wherein the first conductive via is electrically coupled to the fourth conductive plate and the first conductive plate; and forming a second conductive via penetrating the second insulating plate, the third conductive plate, the first insulating plate, and the second conductive plate, wherein the second conductive via is electrically coupled to the third conductive plate and the second conductive plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a capacitive device, comprising:
      a first conductive plate;
      a first insulating plate, disposed on the first conductive plate;
      a second conductive plate, disposed on the first insulating plate;
      a second insulating plate, disposed on the second conductive plate; and
      a third conductive plate, disposed on the second insulating plate;
   a first conductive via, electrically coupled to the first conductive plate and the third conductive plate, the first conductive via extending through a first film stack with a first thickness; and
   a second conductive via, electrically coupled to the second conductive plate, the second conductive via extending through a second film stack with a second thickness, wherein the second film stack comprises:
      a third insulating plate;
      a fourth conductive plate, disposed on the third insulating plate and electrically coupled to the second conductive plate;
      a fourth insulating plate, disposed on the fourth conductive plate; and
      a fifth conductive plate, disposed on the third insulating plate,
      wherein the second conductive via is electrically coupled to the fourth conductive plate and the fifth conductive plate, wherein the second thickness is substantially equal to the first thickness.

2. A semiconductor device, comprising:
   a capacitive device, comprising:
      a first conductive plate;
      a first insulating plate, disposed on the first conductive plate;
      a second conductive plate, disposed on the first insulating plate;
      a second insulating plate, disposed on the second conductive plate; and
      a third conductive plate, disposed on the second insulating plate;
   a first conductive via, electrically coupled to the first conductive plate and the third conductive plate, the first conductive via extending through a first film stack with a first thickness; and
   a second conductive via, electrically coupled to the second conductive plate, the second conductive via extending through a second film stack with a second thickness,
   wherein the second film stack comprises:
      a fourth conductive plate;
      a third insulating plate, disposed on the fourth conductive plate;
      a fifth conductive plate, disposed on the third insulating plate and electrically coupled to the second conductive plate;
      a fourth insulating plate, disposed on the fifth conductive plate; and
      a sixth conductive plate, disposed on the fourth insulating plate,
      wherein the second conductive via is electrically coupled to the fourth conductive plate and the fifth conductive plate, and the second conductive via is electrically disconnected from the sixth conductive plate.

3. The semiconductor device of claim 1, further comprising a third conductive via extending through a third film stack with a third thickness, wherein the third thickness is substantially equal to the first thickness.

4. The semiconductor device of claim 3, wherein the third film stack comprises:
   a third insulating plate;
   a fourth conductive plate, disposed on the third insulating plate;
   a fourth insulating plate, disposed on the fourth conductive plate;
   a fifth conductive plate, disposed on the third insulating plate; and
   wherein the third conductive via is electrically coupled to the fourth conductive plate and the fifth conductive plate.

5. The semiconductor device of claim 3, wherein the third film stack comprises:
   a fourth conductive plate;
   a third insulating plate, disposed on the fourth conductive plate;
   a fifth conductive plate, disposed on the third insulating plate; and
   a fourth insulating plate, disposed on the fifth conductive plate,
   wherein the third conductive via is electrically coupled to the fourth conductive plate and the fifth conductive plate.

6. The semiconductor device of claim 5, wherein the third film stack further comprises:
   a conductive spacer, disposed on a portion of the fourth insulating plate.

7. The semiconductor device of claim 3, wherein the third film stack comprises:
   a fourth conductive plate;
   a third insulating plate, disposed on the fourth conductive plate;
   a conductive spacer, disposed on a portion of the third insulating plate;

a fourth insulating plate, disposed on the third insulating plate and the conductive spacer; and a fifth conductive plate, disposed on the fourth insulating plate, wherein the third conductive via is electrically coupled to the fourth conductive plate and the fifth conductive plate, and the third conductive via is electrically disconnected from the conductive spacer.

8. The semiconductor device of claim 1, wherein the first film stack comprises a fifth insulating plate disposed between the first conductive plate and the third conductive plate, wherein the fifth insulating plate has a thickness substantially equal to a thickness sum of the third insulating plate and the fourth insulating plate.

9. The semiconductor device of claim 2, wherein the third insulating plate covers a sidewall of the fourth conductive plate.

10. A semiconductor device, comprising:
a capacitive device, comprising:
   a first conductive plate;
   a first insulating plate over the first conductive plate;
   a second conductive plate over the first insulating plate;
   a second insulating plate over the second conductive plate; and
   a third conductive plate over the second insulating plate;
a fourth conductive plate adjacent to the capacitive device;
a fifth conductive plate over the fourth conductive plate, wherein the fifth conductive plate is adjacent to and spaced apart from the capacitive device;
a first conductive via electrically coupled to the first conductive plate and the third conductive plate, wherein the first conductive via extends through a first film stack with a first thickness; and
a second conductive via electrically coupled to the fourth conductive plate, wherein the second conductive via extends through a second film stack with a second thickness, and the second film stack comprises the fourth conductive plate, the first insulating plate, the second insulating plate and the fifth conductive plate, wherein the second thickness is substantially equal to the first thickness.

11. The semiconductor device of claim 10, further comprising an oxide layer beneath the capacitive device, wherein the first film stack and the second film stack are formed over the oxide layer.

12. The semiconductor device of claim 10, further comprising an oxide layer over the capacitive device, wherein the first film stack and the second film stack are formed below the oxide layer.

13. The semiconductor device of claim 10, wherein the first film stack comprises the first conductive plate, the first insulating plate, the second insulating plate and the second conductive plate.

14. The semiconductor device of claim 10, further comprising a conductive spacer sandwiched between the first insulating plate and the second insulating plate.

15. The semiconductor device of claim 10, wherein the second insulating plate covers a sidewall of the fourth conductive plate.

16. The semiconductor device of claim 10, wherein the second insulating plate is disposed over the fifth conductive plate.

17. The semiconductor device of claim 10, wherein the second insulating plate is disposed over the fourth conductive plate and the fourth conductive plate is disposed over the first insulating plate.

18. The semiconductor device of claim 1, wherein the second conductive plate and the fourth conductive plate are formed of a same material.

19. The semiconductor device of claim 1, wherein the first insulating plate and the third insulating plate are formed of a same material.

20. The semiconductor device of claim 1, wherein the first conductive plate and the fourth conductive plate are formed of a same material.

* * * * *